United States Patent
Qian et al.

(10) Patent No.: US 11,239,444 B2
(45) Date of Patent: Feb. 1, 2022

(54) DISPLAY PANEL, DISPLAY APPARATUS, METHOD OF FABRICATING DISPLAY PANEL, AND ENCAPSULATING STRUCTURE

(71) Applicant: BOE Technology Group Co., Ltd., Beijing (CN)

(72) Inventors: Lingzhi Qian, Beijing (CN); Song Zhang, Beijing (CN); Rui Hong, Beijing (CN); Penghao Gu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 363 days.

(21) Appl. No.: 16/464,621

(22) PCT Filed: Oct. 29, 2018

(86) PCT No.: PCT/CN2018/112394
§ 371 (c)(1),
(2) Date: May 28, 2019

(87) PCT Pub. No.: WO2020/000819
PCT Pub. Date: Jan. 2, 2020

(65) Prior Publication Data
US 2020/0321554 A1    Oct. 8, 2020

(30) Foreign Application Priority Data
Jun. 29, 2018   (CN) .......................... 201810701544.9

(51) Int. Cl.
*H01L 51/52*   (2006.01)
*H01L 51/56*   (2006.01)
*H01L 23/29*   (2006.01)

(52) U.S. Cl.
CPC ........ *H01L 51/5253* (2013.01); *H01L 23/293* (2013.01); *H01L 51/56* (2013.01); *H01L 2251/303* (2013.01)

(58) Field of Classification Search
None
See application file for complete search history.

(56) References Cited

U.S. PATENT DOCUMENTS

2014/0178700 A1   6/2014   Iwase et al.
2016/0301032 A1*  10/2016  Wang .................. H01L 51/0043

FOREIGN PATENT DOCUMENTS

CN    102544378 A    7/2012
CN    103764301 A    4/2014
(Continued)

OTHER PUBLICATIONS

International Search Report & Written Opinion dated Apr. 8, 2019, regarding PCT/CN2018/112394.
(Continued)

*Primary Examiner* — Anthony Ho
*Assistant Examiner* — Kevin Quinto
(74) *Attorney, Agent, or Firm* — Intellectual Valley Law, P.C.

(57) ABSTRACT

A display panel. The display panel includes a base substrate; a plurality of light emitting elements on the base substrate; and an encapsulating structure encapsulating the plurality of light emitting elements. The encapsulating structure includes a first inorganic encapsulating sublayer; a first organic encapsulating sublayer; and a first amphiphilic cross-linking sublayer between the first inorganic encapsulating sublayer and the first organic encapsulating sublayer.

17 Claims, 12 Drawing Sheets

(56) References Cited

FOREIGN PATENT DOCUMENTS

| | | |
|---|---|---|
| CN | 104377314 A | 2/2015 |
| JP | 2004191756 A | 7/2004 |
| JP | 2004246136 A | 9/2004 |
| JP | 4324718 B2 | 9/2009 |

OTHER PUBLICATIONS

First Office Action in the Chinese Patent Application No. 201810701544.9, dated Mar. 11, 2019; English translation attached.
Second Office Action in the Chinese Patent Application No. 201810701544.9, dated Aug. 13, 2019; English translation attached.

\* cited by examiner

DISPLAY PANEL, DISPLAY APPARATUS, METHOD OF FABRICATING DISPLAY PANEL, AND ENCAPSULATING STRUCTURE

CROSS-REFERENCE TO RELATED APPLICATION

This application is a national stage application under 35 U.S.C. § 371 of International Application No. PCT/CN2018/112394, filed Oct. 29, 2018, which claims priority to Chinese Patent Application No. 201810701544.9, filed Jun. 29, 2018, the contents of which are incorporated by reference in the entirety.

TECHNICAL FIELD

The present invention relates to display technology, more particularly, to a display panel, a display apparatus, a method of fabricating a display panel thereof, and an encapsulating structure.

BACKGROUND

Some electronic devices, such as organic light emitting diode (OLED) devices, have a poor ability to withstand moisture and oxygen. When exposed to moisture or oxygen, the service life of those electronic devices can be shortened. The current leading encapsulating technology is thin film encapsulating technology. For example, an encapsulating thin film can be formed by stacking multiple inorganic encapsulating layers on elements of an electronic devices. An encapsulating thin film can also be formed by alternatively stacking one or more inorganic encapsulating layers and one or more organic encapsulating layers on elements of an electronic devices.

SUMMARY

In one aspect, the present invention provides a display panel comprising a base substrate; a plurality of light emitting elements on the base substrate; and an encapsulating structure encapsulating the plurality of light emitting elements; wherein the encapsulating structure comprises a first inorganic encapsulating sublayer; a first organic encapsulating sublayer; and a first amphiphilic cross-linking sublayer between the first inorganic encapsulating sublayer and the first organic encapsulating sublayer.

Optionally, the first amphiphilic cross-linking sublayer comprises a first cross-linking material comprising a plurality of first functional groups reactive with the first inorganic encapsulating sublayer and a plurality of second functional groups reactive with the first organic encapsulating sublayer, the plurality of second functional groups being different from the plurality of first functional groups.

Optionally, at least a portion of the plurality of first functional groups reacted with the first inorganic encapsulating sublayer forming a plurality of first chemical bonds, at least a portion of the plurality of second functional groups reacted with the first organic encapsulating sublayer forming a plurality of second chemical bonds different from the plurality of first chemical bonds.

Optionally, the plurality of first chemical bonds are a plurality of first covalent bonds; and the plurality of second chemical bonds are a plurality of second covalent bonds.

Optionally, the first cross-linking material comprises a silane coupling agent; the plurality of first functional groups are a plurality of —SiX groups; the plurality of second functional groups are a plurality of —R groups; X is selected from a group consisting of a halogen, an alkoxy group, and an acyloxy group; and —R is selected from a group consisting of an oxy group, a decyl group, a vinyl group, an epoxy group, an amide group, and an aminopropyl group.

Optionally, the silane coupling agent comprises one or a combination of 3-aminopropyltriethoxysilane and 3-glycidoxypropyltrimethoxysilane; the first inorganic encapsulating sublayer comprises one or a combination of silicon oxide, silicon nitride, and silicon oxynitride; and the first organic encapsulating sublayer comprises one or a combination of an epoxy resin and an acrylic resin.

Optionally, the plurality of first functional groups reactive with the first inorganic encapsulating sublayer form a first crosslinked network at a first interface between the first inorganic encapsulating sublayer and the first amphiphilic cross-linking sublayer; and the plurality of second functional groups reactive with the first organic encapsulating sublayer form a second crosslinked network at a second interface between the first organic encapsulating sublayer and the first amphiphilic cross-linking sublayer.

Optionally, the encapsulating structure further comprises a second amphiphilic cross-linking sublayer on a side of the first organic encapsulating sublayer distal to the first inorganic encapsulating sublayer; and a second inorganic encapsulating sublayer on a side of the second amphiphilic cross-linking sublayer distal to the first organic encapsulating sublayer.

Optionally, the second amphiphilic cross-linking sublayer comprises a second cross-linking material comprising a plurality of third functional groups reactive with the second inorganic encapsulating sublayer and a plurality of fourth functional groups reactive with the first organic encapsulating sublayer, the plurality of fourth functional groups being different from the plurality of third functional groups.

Optionally, the encapsulating structure further comprises a third amphiphilic cross-linking sublayer on a side of the first inorganic encapsulating sublayer distal to the first organic encapsulating sublayer; and a second organic encapsulating sublayer on a side of the third amphiphilic cross-linking sublayer distal to the first inorganic encapsulating sublayer.

Optionally, the third amphiphilic cross-linking sublayer comprises a third cross-linking material comprising a plurality of fifth functional groups reactive with the first inorganic encapsulating sublayer and a plurality of sixth functional groups reactive with the second organic encapsulating sublayer, the plurality of sixth functional groups being different from the plurality of fifth functional groups.

Optionally, the first organic encapsulating sublayer comprises a mixture of a cross-linking material and an organic material at least partially cross-linked with each other.

In another aspect, the present invention provides a display apparatus, comprising the display panel of described herein or fabricated by a method described herein, and one or more integrated circuits connected to the display panel In another aspect, the present invention provides a method of fabricating a display panel, comprising forming a plurality of light emitting elements on a base substrate; and forming an encapsulating structure encapsulating the plurality of light emitting elements; wherein forming the encapsulating structure comprises forming a first inorganic encapsulating sublayer; forming a first organic encapsulating sublayer; and forming a first amphiphilic cross-linking sublayer; wherein the first amphiphilic cross-linking sublayer is formed between the first inorganic encapsulating sublayer and the first organic encapsulating sublayer.

Optionally, the method comprising forming a first inorganic material layer, the first inorganic material layer comprising a first inorganic material; forming a first organic material layer, the first organic material layer comprising a first organic material; forming a first amphiphilic cross-linking material layer on a side of the first inorganic material layer facing the first organic material layer or on side of the first organic material layer facing the first inorganic material layer, the first amphiphilic cross-linking material layer is formed to be in direct contact with both the first inorganic material layer and the first organic material layer; reacting at least a portion of a plurality of first functional groups of the first amphiphilic cross-linking material layer with the first inorganic encapsulating sublayer; and reacting at least a portion of a plurality of second functional groups of the first amphiphilic cross-linking material layer with the first organic encapsulating sublayer, thereby forming the first inorganic encapsulating sublayer, the first amphiphilic cross-linking sublayer, and the first organic encapsulating sublayer.

Optionally, forming the first amphiphilic cross-linking material layer is performed between forming one of the first inorganic encapsulating sublayer and the first organic encapsulating sublayer and forming another of the first inorganic encapsulating sublayer and the first organic encapsulating sublayer; and forming the first amphiphilic cross-linking material layer comprises curing a first amphiphilic cross-linking material of the first amphiphilic cross-linking material layer.

Optionally, forming the encapsulating structure comprises forming a first inorganic material layer; mixing a cross-linking material and an organic material to obtain a mixture organic material; forming a mixture organic material layer on a side of the first inorganic material layer distal to the base substrate; and allowing the cross-linking material in the mixture organic material layer to react with the first inorganic material layer at an interface between the first inorganic material layer and the mixture organic material layer, thereby forming the first inorganic encapsulating sublayer and the first amphiphilic cross-linking sublayer.

In another aspect, the present invention provides an encapsulating structure comprising a first inorganic encapsulating sublayer; a first organic encapsulating sublayer; and a first amphiphilic cross-linking sublayer between the first inorganic encapsulating sublayer and the first organic encapsulating sublayer.

Optionally, the first amphiphilic cross-linking sublayer comprises a first cross-linking material comprising a plurality of first functional groups reactive with the first inorganic encapsulating sublayer and a plurality of second functional groups reactive with the first organic encapsulating sublayer, the plurality of second functional groups being different from the plurality of first functional groups.

Optionally, the encapsulating structure comprises one or more inorganic encapsulating sublayers including the first inorganic encapsulating sublayer, and one or more organic encapsulating sublayers including the first organic encapsulating sublayer, the one or more inorganic encapsulating sublayers and the one or more organic encapsulating sublayers alternately stacked; and one or more amphiphilic cross-linking sublayers each of which between one of the one or more inorganic encapsulating sublayers and an adjacent one of the one or more organic encapsulating sublayers.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

An encapsulating thin film is formed by alternatively stacking one or more inorganic encapsulating layers and one or more organic encapsulating layers. Since the ductility of the inorganic encapsulating layer is poor, cracks are likely to occur on the inorganic encapsulating layer. Also, in some encapsulating structure, an organic encapsulating layer is disposed on an inorganic encapsulating layer (e.g. by coating), the binding force between the inorganic encapsulating layer and the organic encapsulating layer is electrostatic adsorption, such as Van der Waals forces, the binding between the inorganic encapsulating layer and the organic encapsulating layer is weak. When the display panel is bent, the inorganic encapsulating layer should be used to release stress, cracks are likely to occur on the inorganic encapsulating layer. Therefore, the moisture and oxygen can contact the elements encapsulated by the encapsulating thin film via those cracks, and the service life of the electronic device may be shortened.

Accordingly, the present disclosure provides, inter alia, a display panel, a display apparatus, a method of fabricating a display panel thereof and an encapsulating structure that substantially obviate one or more of the problems due to limitations and disadvantages of the related art. In one aspect, the present disclosure provides a display panel. In some embodiments, the display panel includes a base substrate; a plurality of light emitting elements on the base substrate; and an encapsulating structure encapsulating the plurality of light emitting elements. Optionally, the encapsulating structure includes a first inorganic encapsulating sublayer; a first organic encapsulating sublayer; and a first amphiphilic cross-linking between the first inorganic encapsulating sublayer and the first organic encapsulating sublayer. The present disclosure provides an amphiphilic cross-linking sublayer between an inorganic encapsulating sublayer and an organic encapsulating sublayer to enhance the bonding between the inorganic encapsulating sublayer and the organic encapsulating sublayer, to reduce the cracks, and to extend the service life of the display panel.

As used herein, in the context of the present disclosure, the term "amphiphilic" refers to a material having a first functional group reactive to an inorganic material to form a first covalent bond, and a second functional group reactive to an organic material to form a second covalent bond.

Figure 1:
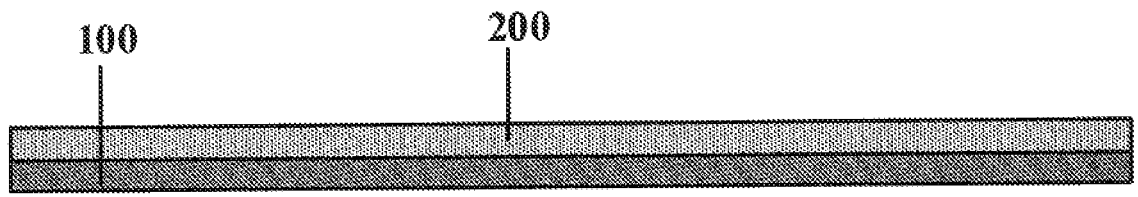
FIG. 1 is a schematic diagram of an encapsulating structure in some embodiments according to the present disclosure.

FIG. 1 is a schematic diagram of an encapsulating structure in some embodiments according to the present disclosure. Referring to FIG. 1, in some embodiments, an encapsulating structure includes an inorganic encapsulating layer 100 and an organic encapsulating layer 200. Optionally, the organic encapsulating layer 200 is disposed on the inorganic encapsulating layer 100. Optionally, the organic encapsulating layer 200 is in direct contact with the inorganic encapsulating layer 100.

In some embodiments, a display panel includes a base substrate; a plurality of light emitting elements on the base substrate; and an encapsulating structure encapsulating the plurality of light emitting elements. Optionally, the encapsulating structure includes a first inorganic encapsulating sublayer; a first organic encapsulating sublayer; and a first amphiphilic cross-linking sublayer between the first inorganic encapsulating sublayer and the first organic encapsulating sublayer. Optionally, the one or more inorganic encapsulating sublayers and the one or more organic encapsulating sublayers are alternatively stacked. Optionally, the first amphiphilic cross-linking sublayer is formed between the first inorganic encapsulating sublayer and the first organic encapsulating sublayer. In one example, the first amphiphilic cross-linking sublayer is in direct contact with the first inorganic encapsulating sublayer. In another example, the first amphiphilic cross-linking sublayer is in direct contact with the first organic encapsulating sublayer.

In some embodiments, the first amphiphilic cross-linking sublayer includes a first cross-linking material. Optionally, the first cross-linking material includes a plurality of first functional groups reactive with the first inorganic encapsulating sublayer. Optionally, the first cross-linking material includes a plurality of second functional groups reactive with the first organic encapsulating sublayer. Optionally, the plurality of second functional groups being different from the plurality of first functional groups.

In some embodiments, at least a portion of the plurality of first functional groups reacted with the first inorganic encapsulating sublayer forming a plurality of first chemical bonds, at least a portion of the plurality of second functional groups reacted with the first organic encapsulating sublayer forming a plurality of second chemical bonds different from the plurality of first chemical bonds. The plurality of first chemical bonds and the plurality of second chemical bonds enhance the connection between the first inorganic encapsulating sublayer and the first organic encapsulating sublayer.

Figure 2A:
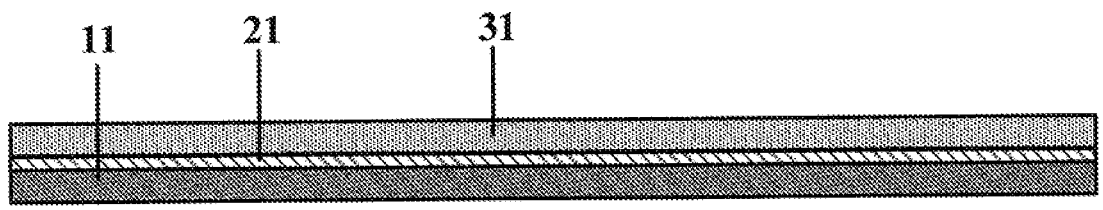
FIG. 2A is a schematic diagram of an encapsulating structure in some embodiments according to the present disclosure.

FIG. 2A is a schematic diagram of an encapsulating structure in some embodiments according to the present disclosure. Referring to FIG. 2A, in some embodiments, an encapsulating structure includes a first inorganic encapsulating sublayer 11, a first organic encapsulating sublayer 31, and a first amphiphilic cross-linking sublayer 21. Optionally, the first inorganic encapsulating sublayer 11 and the first organic encapsulating sublayer 31 are alternatively stacked. Optionally, the first amphiphilic cross-linking sublayer 21 is formed between the first inorganic encapsulating sublayer 11 and the first organic encapsulating sublayer 31. One example, the first amphiphilic cross-linking sublayer 21 is in direct contact with the first inorganic encapsulating sublayer 11. In another example, the first amphiphilic cross-linking sublayer is in direct contact with the first organic encapsulating sublayer 31.

In some embodiments, the first amphiphilic cross-linking sublayer 21 includes a first cross-linking material. Optionally, the first cross-linking material includes a plurality of first functional groups reactive with the first inorganic encapsulating sublayer. Optionally, the first cross-linking material includes a plurality of second functional groups reactive with the first organic encapsulating sublayer. Optionally, the plurality of second functional groups being different from the plurality of first functional groups.

In some embodiments, at least a portion of the plurality of first functional groups reacted with the first inorganic encapsulating sublayer forming a plurality of first chemical bonds, at least a portion of the plurality of second functional groups reacted with the first organic encapsulating sublayer forming a plurality of second chemical bonds different from the plurality of first chemical bonds. The plurality of first chemical bonds and the plurality of second chemical bonds enhance the connection between the first inorganic encapsulating sublayer and the first organic encapsulating sublayer.

In some embodiments, an inorganic encapsulating sublayer has stronger ability to isolated moisture and oxygen from contacting the encapsulated display components. On the other hand, an organic encapsulating sublayer has better ductility to release the stress induced in the inorganic encapsulating sublayer, avoiding occurrence of cracks in the inorganic encapsulating sublayer when the encapsulating structure is bent. In some embodiments, the first amphiphilic cross-linking sublayer 21 bonds with the first inorganic encapsulating sublayer 11 using the plurality of first chemical bonds, and the first amphiphilic cross-linking sublayer 21 bonds with the first organic encapsulating sublayer 31 using the plurality of the second chemical bonds. The plurality of the first chemical bonds and the plurality of the second chemical bonds may make the connection between the first inorganic encapsulating sublayer 11 and the first organic encapsulating sublayer 31 stronger. In some embodiments, when the first inorganic encapsulating sublayer 11 is bent, on one hand, the encapsulating structure may prevent the first inorganic encapsulating sublayer 11 and the first organic encapsulating sublayer 31 from curling and separating from each other; on other hand the first inorganic encapsulating sublayer 11 may better release stress via the first organic encapsulating sublayer 31, which may prevent cracks from forming on the first inorganic encapsulating sublayer 11. Reducing the chance of having cracks on the first inorganic encapsulating sublayer 11 and the chance of having separation between the first inorganic encapsulating sublayer 11 and the second inorganic encapsulating sublayer 12 may reduce the chance of moisture and oxygen contacting the elements encapsulated by the encapsulating structure 10, therefore, the elements encapsulated will not be damaged by the moisture and oxygen, and the service life of the elements encapsulated can be extended.

In some embodiments, in the encapsulating structure, the binding force between the first amphiphilic cross-linking sublayer 21 and the first inorganic encapsulating sublayer 11 is chemical bonding force, and the binding force between the first amphiphilic cross-linking sublayer 21 and the first organic encapsulating sublayer 31 is chemical bonding force. The chemical bonding force is stronger than electrostatic adsorption (e.g. Van der Waals forces).

In some embodiments, the first cross-linking material includes a silane coupling agent. Optionally, the plurality of first functional groups are a plurality of —SiX groups. For example, X is selected from a group consisting of a halogen, an alkoxy group, and an acyloxy group. Optionally, the plurality of second functional groups are a plurality of –R groups. For example, –R is selected from a group consisting of an oxy group, a decyl group, a vinyl group, an epoxy group, an amide group, and an aminopropyl group. Optionally, the plurality of first chemical bonds are a plurality of first covalent bonds. Optionally, the plurality of second chemical bonds are a plurality of second covalent bonds. For example, the plurality of first chemical bonds is hydrogen bond.

In some embodiments, a silane coupling agent include two kinds of functional groups. Optionally, the silane coupling agent includes the plurality of first functional groups and the plurality of second functional groups. In one example, the plurality of first functional groups is at one end of a molecular chain of the silane coupling agent. In another example, the plurality of second functional groups is at the other end of the molecular chain of the silane coupling agent. For example, during the process of forming an encapsulating structure 10, a surface of the first inorganic encapsulating sublayer 11 includes a plurality of hydroxyl groups (—OH), at least a portion of the plurality of first functional groups locating at one end of the molecular chain of the silane coupling agent reacted with the plurality of hydroxyl groups (—OH) on the surface of the first inorganic encapsulating sublayer 11 forming the plurality of first covalent bonds (e.g. hydrogen bonds). And at least a portion of the plurality of second functional groups locating at the other end of the molecular chain of the silane coupling agent reacted with an organic material (e.g. resin) of the first organic encapsulating sublayer 31 forming the plurality of second covalent bonds. A cross-linking is formed between the silane coupling agent and the first inorganic encapsulating sublayer 11, and a cross-linking is formed between the silane coupling agent and the first organic encapsulating sublayer 31. The binding between the first inorganic encapsulating sublayer 11 and the first organic encapsulating sublayer 31 becomes stronger.

In some embodiments, at a first interface between the first inorganic encapsulating sublayer 11 and the first amphiphilic cross-linking sublayer 21, at least a portion of the plurality of first functional groups (e.g. SiX—) reacted with the first inorganic encapsulating sublayer 11 forming the plurality of first chemical bonds. In some embodiments, at a second interface between the first organic encapsulating sublayer 31 and the first amphiphilic cross-linking sublayer 21, at least a portion of the plurality of second functional groups (e.g. R—) enacted with the first organic encapsulating sublayer 31 forming a plurality of second chemical bonds different from the plurality of first chemical bonds.

In some embodiments, the plurality of first functional groups reactive with the first inorganic encapsulating sublayer 11 form a first crosslinked network at the first interface between the first inorganic encapsulating sublayer 11 and the first amphiphilic cross-linking sublayer 21. In some embodiments, the plurality of second functional groups reactive with the first organic encapsulating sublayer 31 from a second crosslinked network at the second interface between the first organic encapsulating sublayer 31 and the first amphiphilic cross-linking sublayer 21. Optionally, the first crosslinked network is formed by a plurality of molecules having the plurality of first chemical bonds crossing with each other. Optionally, the second crosslinked network is formed by a plurality of molecules having the plurality of second chemical bonds crossing with each other. Optionally, the first crosslinked network can make the binding between the first inorganic encapsulating sublayer 11 and the first amphiphilic cross-linking sublayer 21 stronger. The second crosslinked network can make the binding between the first organic encapsulating sublayer 31 and the first amphiphilic cross-linking sublayer 21 stronger. And the binding between the first inorganic encapsulating sublayer 11 and the first organic encapsulating sublayer 31 becomes stronger.

In some embodiments, the silane coupling agent includes one or a combination of 3-aminopropyltriethoxysilane and 3-glycidoxypropyltrimethoxysilane. Optionally, the first inorganic encapsulating sublayer 11 includes one or a combination of silicon oxide, silicon nitride, and silicon oxynitride. Optionally, the first organic encapsulating sublayer 31 includes one or a combination of an epoxy resin and an acrylic resin. Optionally, the plurality of hydroxyl groups (—OH) are present on surfaces of the one or the combination of silicon oxide, silicon nitride, and silicon oxynitride, achieving an excellent binding between the first inorganic encapsulating sublayer 11 and the first organic encapsulating sublayer 31. In one example, in the process of forming an encapsulating structure, the material forming the first inorganic encapsulating sublayer 11 is silicon oxide. At least a portion of the material (e.g. silicon oxide) on a surface of the first inorganic encapsulating sublayer 11 reacted with the water in the air forming a plurality of hydroxyl groups (—OH). In another example, the material forming the first inorganic encapsulating sublayer 11 is silicon nitride. At least a portion of the material (e.g. silicon nitride) on the surface of the first inorganic encapsulating sublayer 11 reacted with the water in air forming a plurality of silicon oxides, and further forming a plurality of hydroxyl groups (—OH) on the surface of the first inorganic encapsulating sublayer 11. In another example, the material forming the first inorganic encapsulating sublayer 11 is silicon oxynitride. At least a portion of the material (e.g. silicon oxynitride) on the surface of the first inorganic encapsulating sublayer 11 reacted with the water in air forming a plurality of hydroxyl groups (—OH).

In some embodiments, the silane coupling agent includes 3-aminopropyltriethoxysilane, the plurality of first functional groups of the silane coupling agent is siloxy, the plurality of second function groups of the silane coupling agent is aminopropyl. Optionally, the silane coupling agent includes 3-glycidoxypropyltrimethoxysilane, the plurality of first functional groups of the silane coupling agent is siloxy, the plurality of second function groups of the silane coupling agent is oxyl. In one example, at least a portion of the plurality of first functional groups (e.g. siloxy) reacted with at least a portion of the plurality of hydroxyl groups (—OH) on the surface of the first inorganic encapsulating sublayer 11 forming the plurality of first chemical bonds. In another example, at least a portion of the plurality of second functional groups (e.g. aminopropyl, oxyl) reacted with the first organic encapsulating sublayer 31 forming the plurality of the second chemical bonds, the first organic encapsulating sublayer 31 includes one or a combination of an epoxy resin and an acrylic resin. The binding strength between the one or the combination of 3-aminopropyltriethoxysilane and 3-glycidoxypropyltrimethoxysilane and the first inorganic encapsulating sublayer 11 is relatively strong. And the binding strength between the one or the combination of 3-aminopropyltriethoxysilane and 3-glycidoxypropyltrimethoxysilane and the first organic encapsulating sublayer 31 is relatively strong. The binding between the first inorganic encapsulating sublayer 11 and the first organic encapsulating sublayer 31 is relatively strong. Optionally, the amount of the plurality of hydroxyl groups (—OH) on a surface of silicon oxide is relatively rich, the binding strength between the first inorganic encapsulating sublayer 11 formed by silicon oxide and the silane coupling agent is stronger, and the effect of binding between the first inorganic encapsulating sublayer 11 and the first organic encapsulating sublayer 31 is better.

Figure 2B:
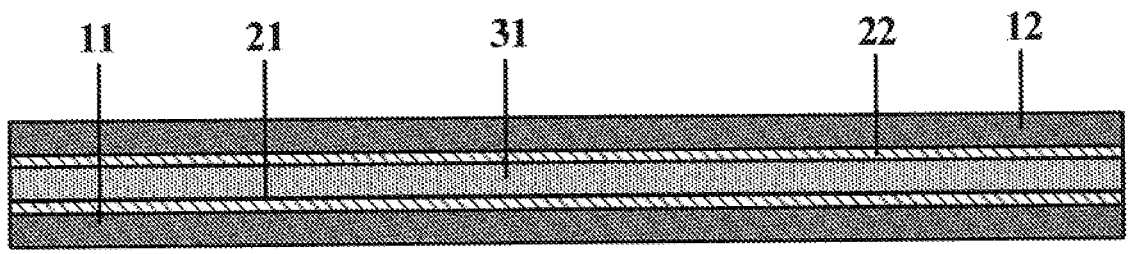
FIG. 2B is a schematic diagram of an encapsulating structure in some embodiments according to the present disclosure.

FIG. 2B is a schematic diagram of an encapsulating structure in some embodiments according to the present disclosure. Referring to FIG. 2B, in some embodiments, the encapsulating structure includes a first inorganic encapsulating sublayer 11; a first organic encapsulating sublayer 31; and a first amphiphilic cross-linking sublayer 21 between the first inorganic encapsulating sublayer 11 and the first organic encapsulating sublayer 31. In some embodiments, the encapsulating structure further includes a second amphiphilic cross-linking sublayer 22 on a side of the first organic encapsulating sublayer 31 distal to the first inorganic encapsulating sublayer 11; and a second inorganic encapsulating sublayer 12 on a side of the second amphiphilic cross-linking sublayer 22 distal to the first organic encapsulating sublayer 31. Optionally, the second amphiphilic cross-linking sublayer 22 is formed between the first organic encapsulating sublayer 31 and the second inorganic encapsulating sublayer 12. Optionally, the second amphiphilic cross-linking sublayer 22 is in direct contact with the first organic encapsulating sublayer 31. The second amphiphilic cross-linking sublayer 22 is in direct contact with the second inorganic encapsulating sublayer 12.

In some embodiments, the second amphiphilic cross-linking sublayer 22 include a second cross-linking material including a plurality of third functional groups reactive with the second inorganic encapsulating sublayer 12, and a plurality of fourth functional groups reactive with the first organic encapsulating sublayer 31. Optionally, the plurality of fourth functional groups is different from the plurality of third functional groups.

In some embodiments, at least a portion of the plurality of third functional groups reacted with the second inorganic encapsulating sublayer 12 forming a plurality of third chemical bonds. At least a portion of the plurality of fourth functional groups reacted with the first organic encapsulating sublayer 31 forming a plurality of fourth chemical bonds different from the plurality of third chemical bonds.

In some embodiments, the outmost layers of the encapsulating structure 10 are inorganic encapsulating sublayers, which may enhance the stability of the encapsulating structure 10. Optionally, an inorganic encapsulating sublayer is formed between two organic encapsulating sublayers, the encapsulating structure further includes an amphiphilic cross-linking sublayer between the inorganic encapsulating sublayer and a respective one of the two organic encapsulating sublayers. Optionally, the encapsulating structure can be designed according to specific properties of display components encapsulated by the encapsulating structure.

In some embodiments, the second inorganic encapsulating sublayer 12 includes one or a combination of silicon oxide, silicon nitride, and silicon oxynitride. In some embodiments, the second cross-linking material including a silane coupling agent. The plurality of third functional groups are a plurality of —SiX groups. The plurality of fourth functional groups are a plurality of —R groups. Optionally, X is selected from a group consisting of a halogen, an alkoxy group, and an acyloxy group. Optionally, —R is selected from a group consisting of an oxy group, a decyl group, a vinyl group, an epoxy group, an amide group, and an aminopropyl group.

In some embodiments, types of the plurality of third functional groups of the second amphiphilic cross-linking sublayer 22 can be the same as types of the plurality of first functional groups of the first amphiphilic cross-linking sublayer 21. Types of the plurality of fourth functional groups of the second amphiphilic cross-linking sublayer 22 can be the same as types of the plurality of second functional groups of the first amphiphilic cross-linking sublayer 21. Optionally, types of the plurality of third functional groups of the second amphiphilic cross-linking sublayer 22 can be different from types of the plurality of first functional groups of the first amphiphilic cross-linking sublayer 21. Types of the plurality of fourth functional groups of the second amphiphilic cross-linking sublayer 22 can be different from types of the plurality of second functional groups of the first amphiphilic cross-linking sublayer 21.

In some embodiments, the material forming the second inorganic encapsulating sublayer 12 can be the same as the material forming the first inorganic encapsulating sublayer 11. Optionally, the material forming the second inorganic encapsulating sublayer 12 can be different from the material forming the first inorganic encapsulating sublayer 11.

In some embodiments, the plurality of third chemical bonds formed after a portion of the plurality of third functional groups of the second amphiphilic cross-linking sublayer 22 reacted with the second inorganic encapsulating sublayer 12 are the same as the plurality of first chemical bonds formed after a portion of the plurality of first functional groups of the first amphiphilic cross-linking sublayer 21 reacted with the first inorganic encapsulating sublayer 11. Optionally, the plurality of third chemical bonds formed after a portion of the plurality of third functional groups of the second amphiphilic cross-linking sublayer 22 reacted with the second inorganic encapsulating sublayer 12 are different from the plurality of first chemical bonds formed after a portion of the plurality of first functional groups of the first amphiphilic cross-linking sublayer 21 reacted with the first inorganic encapsulating sublayer 11.

In some embodiments, the plurality of fourth chemical bonds formed after a portion of the plurality of fourth functional groups reacted with the first organic encapsulating sublayer 31 are the same as the plurality of second chemical bonds formed after a portion of the plurality of second functional groups reacted with the first organic encapsulating sublayer 31. Optionally, the plurality of fourth chemical bonds formed after a portion of the plurality of fourth functional groups reacted with the first organic encapsulating sublayer 31 are different from the plurality of second chemical bonds formed after a portion of the plurality of second functional groups reacted with the first organic encapsulating sublayer 31.

Figure 2C:
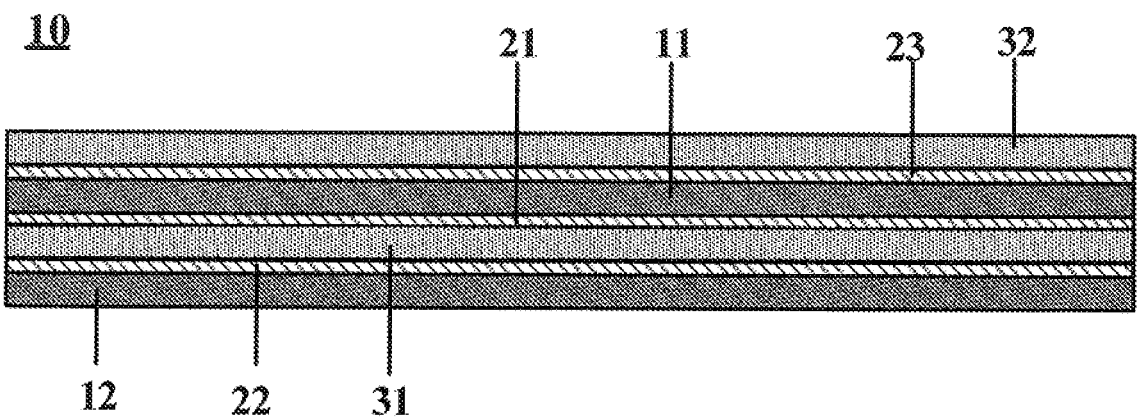
FIG. 2C is a schematic diagram of an encapsulating structure in some embodiments according to the present disclosure.

FIG. 2C is a schematic diagram of an encapsulating structure in some embodiments according to the present disclosure. Referring to FIG. 2C, in some embodiments, an encapsulating structure includes a first inorganic encapsulating sublayer 11; a first organic encapsulating sublayer 31; a first amphiphilic cross-linking sublayer between the first inorganic encapsulating sublayer and the first organic encapsulating sublayer; a second amphiphilic cross-linking sublayer 22 on a side of the first organic encapsulating sublayer 31 distal to the first organic encapsulating sublayer 31; and a second inorganic encapsulating sublayer 12 on a side of the second amphiphilic cross-linking sublayer 22 distal to the first organic encapsulating sublayer 31. In some embodiments, the encapsulating structure further includes a third amphiphilic cross-linking sublayer 23 on a side of the first inorganic encapsulating sublayer 11 distal to the first organic encapsulating sublayer 31; and a second organic encapsulating sublayer 32 on a side of the third amphiphilic cross-linking sublayer 23 distal to the first inorganic encapsulating sublayer 11. Optionally, the third amphiphilic cross-linking sublayer 23 includes a third cross-linking material including a plurality of fifth functional groups reactive with the first inorganic encapsulating sublayer 11 and a plurality of sixth functional groups reactive with the second organic encapsulating sublayer 32. Optionally, the plurality of sixth functional group is different from the plurality of fifth functional groups.

In some embodiments, at least a portion of the plurality of fifth functional groups reacted with the first inorganic encapsulating sublayer 11 forming a plurality of fifth chemical bonds. At least a portion of the plurality of sixth functional groups reacted with the second organic encapsulating sublayer 32 forming a plurality of sixth chemical bonds different from the plurality of fifth chemical bonds.

In some embodiments, the second organic encapsulating sublayer 32 includes one or a combination of an epoxy resin and an acrylic resin. In some embodiments, the third cross-linking material including, a silane coupling agent. The plurality of fifth functional groups are a plurality of —SiX groups. The plurality of sixth functional groups are a plurality of —R groups. Optionally, X is selected from a group consisting of a halogen, an alkoxy group, and an acyloxy group. Optionally, —R is selected from a group consisting of an oxy group, a decyl group, a vinyl group, an epoxy group, an amide group, and an aminopropyl group.

In some embodiments, types of the plurality of fifth functional groups of the third amphiphilic cross-linking sublayer 23 can be the same as types of the plurality of first functional groups of the first amphiphilic cross-linking sublayer 21, or as the types of the plurality of third functional groups of the second amphiphilic cross-linking sublayer 22. Types of the plurality of sixth functional groups of the third amphiphilic cross-linking sublayer 23 can be the same as types of the plurality of second functional groups of the first amphiphilic cross-linking sublayer 21, or as types of the plurality of fourth functional groups of the second amphiphilic cross-linking sublayer 22. Optionally, types of the plurality of fifth functional groups of the third amphiphilic cross-linking sublayer 23 can be different from types of the plurality of first functional groups of the first amphiphilic cross-linking sublayer 21, or from types of the plurality of third functional groups of the second amphiphilic cross-linking sublayer 22. Types of the plurality of sixth functional groups of the third amphiphilic cross-linking sublayer 23 can be different from types of the plurality of second functional groups of the first amphiphilic cross-linking sublayer 21, or from Types of the plurality of fourth functional groups of the second amphiphilic cross-linking sublayer 22.

In some embodiments, the material forming the second organic encapsulating sublayer 32 can be the same as the material forming the first organic encapsulating sublayer 31. Optionally, the material forming the second organic encapsulating sublayer 32 can be different from the material forming the first organic encapsulating sublayer 31.

In some embodiments, the plurality of fifth chemical bonds are the same as the plurality of first chemical bonds, or as the plurality of third chemical bonds. Optionally, the plurality of fifth chemical bonds are different from the plurality of first chemical bonds, or from the plurality of third chemical bonds.

In some embodiments, the plurality of sixth chemical bonds are the same as the plurality of second chemical bonds, or as the plurality of fourth chemical bonds. Optionally, the plurality of sixth chemical bonds are different from the plurality of second chemical bonds, or from the plurality of fourth chemical bonds.

Figure 3A:
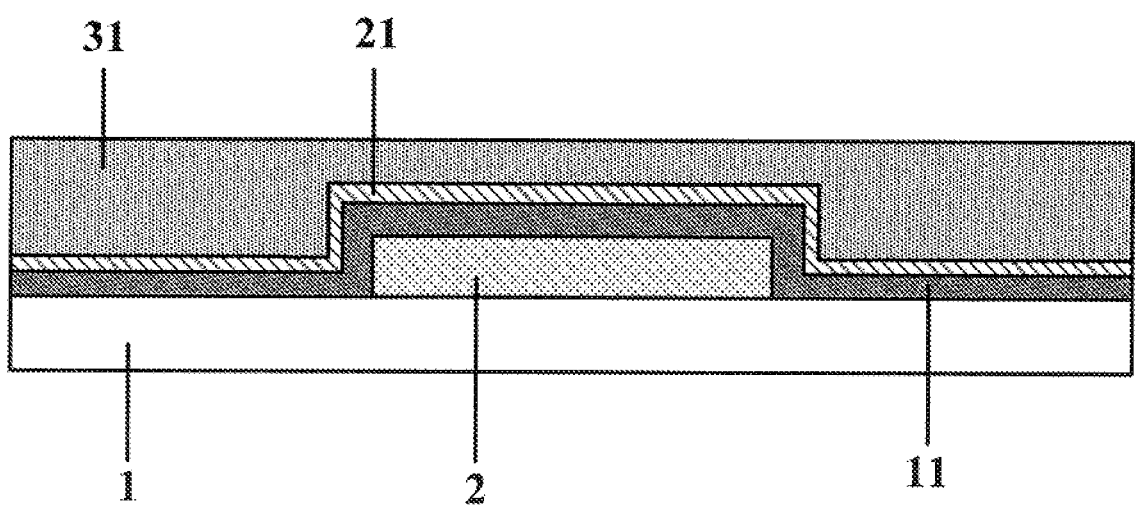
FIG. 3A is a schematic diagram of a structure of a display panel after the encapsulating structure in FIG. 2A encapsulates a plurality of light emitting elements according to the present disclosure.

FIG. 3A is a schematic diagram of a structure of a display panel after the encapsulating structure in FIG. 2A encapsulates a plurality of light emitting elements according to the present disclosure. Referring to FIG. 3A, one of a plurality of light emitting elements 2 on a base substrate 1 is encapsulated using the encapsulating structure in FIG. 2A. In some embodiments, the first inorganic encapsulating sublayer 11 is disposed on a side of the base substrate 1 facing the plurality of light emitting elements, covering the plurality of light emitting elements 2 and at least a portion of the base substrate 1, thereby encapsulating the plurality of light emitting elements 2.

Various appropriate materials may be used for making the plurality of light emitting elements 2. Examples of materials suitable for making the plurality of light emitting elements 2 include, but not limited to, electronic elements such as OLED devices.

Various appropriate materials may be used for making the base substrate 1. Examples of materials suitable for making the base substrate 1 include, but not limited to glass, quartz, flexible materials such as polyimide.

In some embodiments, the first amphiphilic cross-linking sublayer 21 may enhance the binding strength between the first inorganic encapsulating sublayer 11 and the first organic encapsulating sublayer 31. When the first inorganic encapsulating sublayer 11 is bent, on one hand, the encapsulating structure may prevent the first inorganic encapsulating sublayer 11 and the first organic encapsulating sublayer 31 from curling and separating from each other; on other hand the first inorganic encapsulating sublayer 11 may better release stress via the first organic encapsulating sublayer 31, which may prevent cracks from forming on the first inorganic encapsulating sublayer 11. Reducing the chance of having cracks on the first inorganic encapsulating sublayer 11 and the chance of having separation between the first inorganic encapsulating sublayer 11 and the second inorganic encapsulating sublayer 12 may reduce the chance of moisture and oxygen contacting the light emitting elements 2 encapsulated by the encapsulating structure 10, therefore, the light emitting elements 2 encapsulated will not be damaged by the moisture and oxygen, and the service life of the light emitting elements 2 encapsulated can be extended. Optionally, the first inorganic encapsulating sublayer 11 is disposed on a side of the first organic encapsulating sublayer 31 facing the plurality of light emitting elements 2, which is better to prevent moisture, oxygen and other substance from damage the plurality of light emitting elements 2.

Figure 3B:
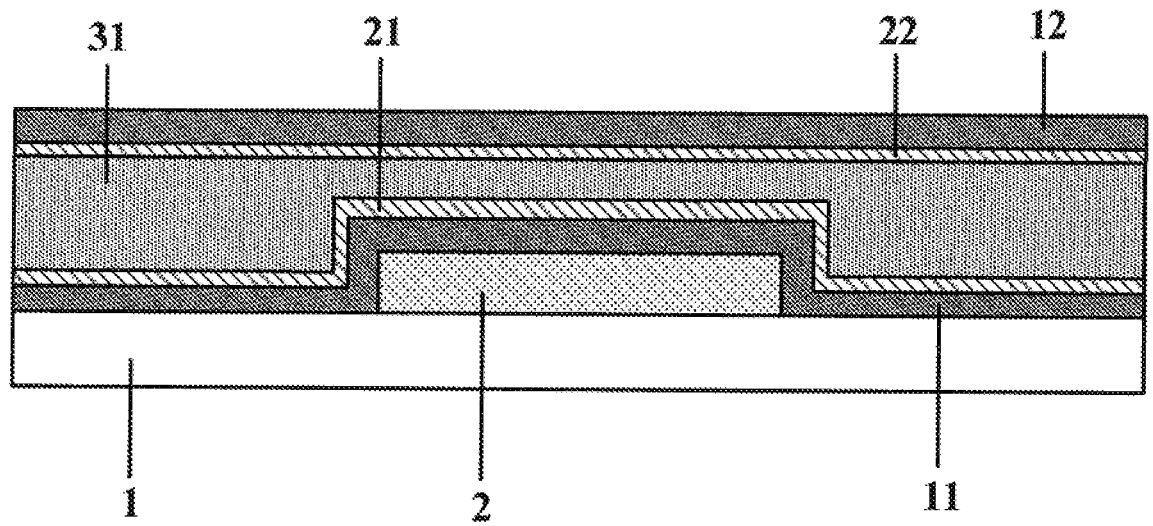
FIG. 3B is a schematic diagram of a structure of a display panel after the encapsulating structure in FIG. 2B encapsulates a plurality of light emitting elements according to the present disclosure.

FIG. 3B is a schematic diagram of a structure of a display panel after the encapsulating structure in FIG. 2B encapsulates a plurality of light emitting elements according to the present disclosure. Referring to FIG. 3B, in some embodiments, the first inorganic encapsulating sublayer 11 is disposed on a side of the first organic encapsulating sublayer 31 facing the plurality of light emitting elements 2, which may electively prevent moisture, oxygen, and other substances from contacting with the plurality of light emitting elements 2. Optionally, the first organic encapsulating sublayer 31 is disposed on a side of the first inorganic encapsulating sublayer 11 facing the plurality of light emitting elements 2. In some embodiments, in the encapsulating structure, a layer in direct contact with the plurality of light emitting elements 2 is an inorganic encapsulating sublayer. A layer on a side of the encapsulating structure distal to the plurality of the light emitting elements 2 is also an inorganic encapsulating sublayer. Optionally, an amphiphilic cross-linking sublayer is disposed between an inorganic encapsulating sublayer and an adjacent organic encapsulating sublayer, which may enhance the binding strength of the inorganic encapsulating sublayer and the adjacent organic encapsulating sublayer. And the binding between the inorganic encapsulating sublayer and the adjacent organic encapsulating sublayer may effectively prevent moisture, oxygen, and other substances from contacting the plurality of light emitting elements.

Figure 3C:
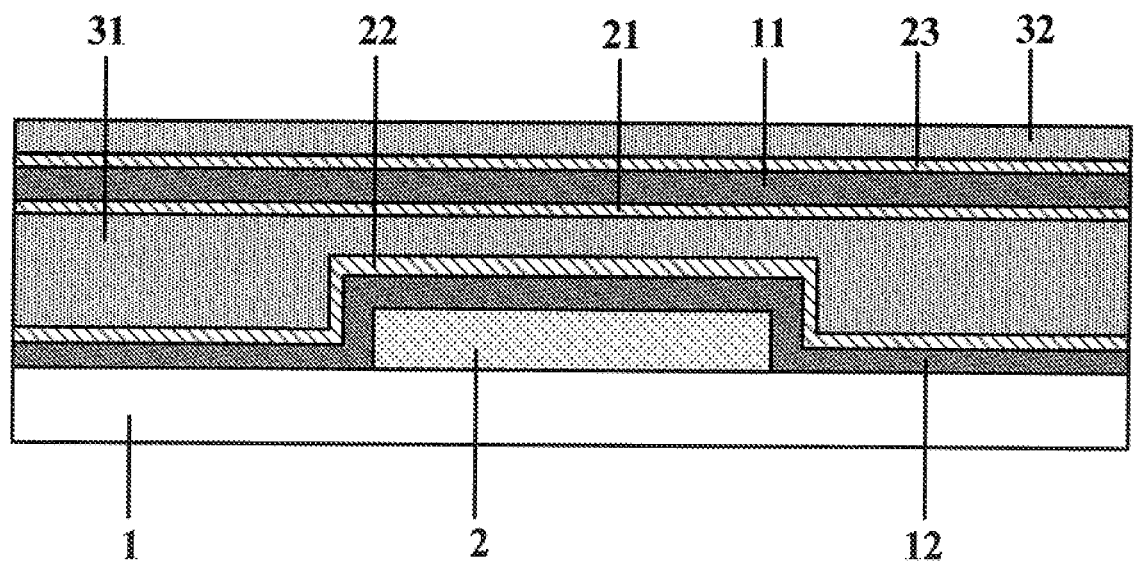
FIG. 3C is a schematic diagram of a structure of a display panel after the encapsulating structure in FIG. 2C encapsulates a plurality of light emitting elements according to the present disclosure.

FIG. 3C is a schematic diagram of a structure of a display panel after the encapsulating structure in FIG. 2C encapsulates a plurality of light emitting elements according to the present disclosure. Referring to FIG. 3C, in some embodiments, the second inorganic encapsulating sublayer 12 is disposed on a side of the first organic encapsulating sublayer 31 facing the plurality of light emitting elements 2, which may effectively prevent moisture, oxygen, and other substances from contacting with the plurality of light emitting elements 2. Optionally, the first organic encapsulating sublayer 31 is disposed on a side of the first inorganic encapsulating sublayer 11 facing the plurality of light emitting elements 2. In some embodiments, in the encapsulating structure, a layer in direct contact with the plurality of light emitting elements 2 is an inorganic encapsulating sublayer. A layer on a side of the encapsulating structure distal to the plurality of the light emitting elements 2 is also an inorganic encapsulating sublayer. Optionally, an amphiphilic cross-linking sublayer is disposed between an inorganic encapsulating sublayer and an adjacent organic encapsulating sublayer, which may enhance the binding strength of the inorganic encapsulating sublayer and the adjacent organic encapsulating sublayer. And the binding between the inorganic encapsulating sublayer and the adjacent organic encapsulating sublayer may effectively prevent moisture, oxygen, and other substances from contacting the plurality of light emitting elements.

In another aspect, the present disclosure also provides a display apparatus. In some embodiments, the display apparatus includes the encapsulating structure mentioned herein, and the plurality of light emitting elements. Optionally, the encapsulating structure encapsulates the plurality of light emitting elements. Optionally, one inorganic encapsulating layer of the encapsulating structure is in direct contact with the plurality of light emitting elements. In one example, the plurality of light emitting elements may be OLED devices.

Figure 4:
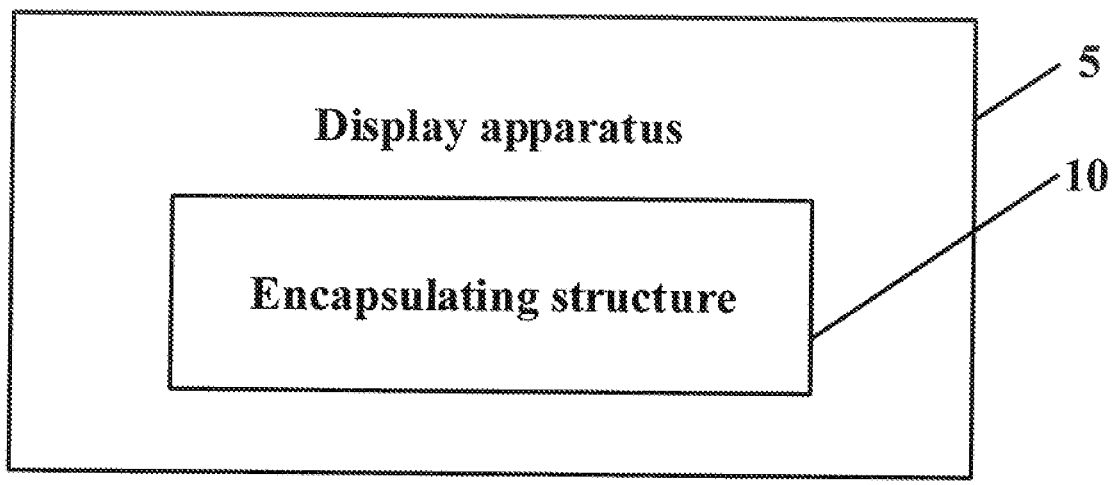
FIG. 4 is a schematic diagram of a display apparatus in some embodiments according to the present disclosure.
Figure 5:
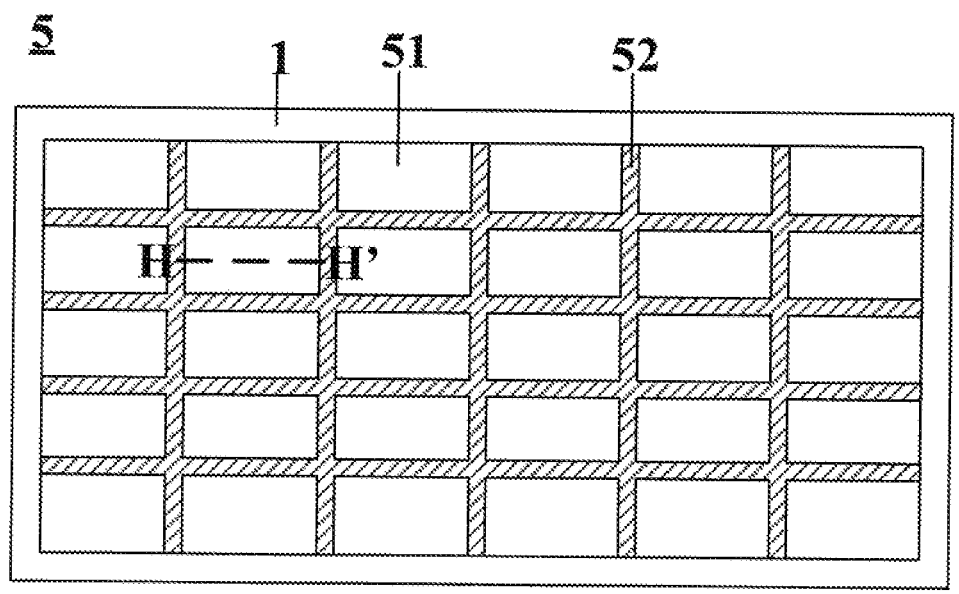
FIG. 5 is a plan view of an electronic apparatus in some embodiments according to the present disclosure.

FIG. 4 is a schematic diagram of a display apparatus in some embodiments according to the present disclosure. FIG. 5 is a plan view of an electronic apparatus in some embodiments according to the present disclosure. Referring to FIG. 4, in some embodiments, an electronic apparatus 5 includes an encapsulating structure 10. Referring to FIG. 5, the electronic apparatus 5 includes a plurality of functional units 51. Optionally, the plurality of functional units 51 are arranged in an array. In some embodiments, the electronic apparatus 5 can be a display apparatus, such as OLED display apparatus. Optionally, the electronic apparatus 5 can be a light emitting apparatus.

In some embodiments, the electronic apparatus 5 including the display panel herein, and one or more integrated circuits connected to the display panel herein.

In some embodiments, the electronic apparatus 5 is a display apparatus. The plurality of functional units 51 are a plurality of subpixels. Optionally, the electronic apparatus 5 further includes a pixel definition layer 52 defining the plurality of subpixels.

Each of FIG. 3A, FIG. 3B, or FIG. 3C shows a cross-sectional view of one of the plurality of subpixels along a direction from H to H' on a plane perpendicular to the base substrate 1. Referring to both FIG. 3B and FIG. 5, in the electronic apparatus 5, the layer of encapsulating structure in direct contact with the plurality of light emitting elements is the first inorganic encapsulating sublayer 11. The layer on a side of the encapsulating structure distal to the light emitting elements is the second inorganic encapsulating sublayer 12. Accordingly, the inner most and outer most sublayers of the encapsulating structure with respect to the plurality of light emitting elements are both inorganic encapsulating sublayers. The binding strength between the first inorganic encapsulating sublayer 11 and the first organic encapsulating sublayer 31 and the binding strength between the first organic encapsulating sublayer 31 and the second inorganic encapsulating sublayer 12 can be enhanced, effectively preventing the moisture and oxygen from contacting and damaging the plurality of light emitting elements. For example, the encapsulating structure encapsulates not only the plurality of functional units 51 (e.g. the plurality of subpixels), but also the pixel definition layer 52.

Various appropriate apparatuses may be used as the electronic apparatus 5. Examples of apparatuses suitable to be used as the electronic apparatus 5 include, but not limited to mobile phones, tablets, TVs, display panels, laptops, digital cameras, navigators, lighting devices, and apparatuses having display function. Optionally, lighting devices include OLED lighting devices, decorative lanterns, flexible lighting devices.

In another aspect, the present disclosure also provides a method of fabricating a display panel. The method of fabricating a display panel includes forming a plurality of light emitting elements on a base substrate; and forming an encapsulating structure encapsulating the plurality of light emitting elements. Optionally, forming the encapsulating structure includes forming a first inorganic encapsulating sublayer; forming a first organic encapsulating sublayer; and forming a first amphiphilic cross-linking sublayer. Optionally, the first amphiphilic cross-linking sublayer is formed between the first inorganic encapsulating sublayer and the first organic encapsulating sublayer. Optionally, the first amphiphilic cross-linking sublayer is in direct contact with the first inorganic encapsulating sublayer. Optionally, the first amphiphilic cross-linking sublayer is in direct contact with the first organic encapsulating sublayer. Optionally, the first amphiphilic cross-linking sublayer includes a first cross-linking material including a plurality of first functional groups reactive with the first inorganic encapsulating sublayer and a plurality of second functional groups reactive with the first organic encapsulating sublayer. Optionally, the plurality of second functional groups are different from the plurality of first functional groups. In one example, at least a portion of the plurality of first functional groups reacted with the first inorganic encapsulating sublayer forming a plurality of first chemical bonds. In another example, at least a portion of the plurality of second functional groups reacted with the first organic encapsulating sublayer forming a plurality of second chemical bonds different from the plurality of first chemical bonds.

In some embodiments, the method of fabricating a display panel further includes forming a first inorganic material layer. Optionally, the first inorganic material layer includes a first inorganic material. In some embodiments, the method of fabricating a display panel further includes forming a first organic material layer. Optionally, the first organic material layer includes a first organic material. In some embodiments, the method of fabricating a display panel further includes forming a first amphiphilic cross-linking material layer on a side of the first inorganic material layer facing the first organic material layer or on side of the first organic material layer facing the first inorganic material layer. Optionally, the first amphiphilic cross-linking material layer is formed to be in direct contact with both the first inorganic material layer and the first organic material layer. In some embodiments, the method of fabricating a display panel further includes reacting at least a portion of a plurality of first functional groups of the first amphiphilic cross-linking material layer with the first inorganic encapsulating sublayer; and reacting at least a portion of a plurality of second functional groups of the first amphiphilic cross-linking material layer with the first organic encapsulating sublayer, thereby forming the first inorganic encapsulating sublayer, the first amphiphilic cross-linking sublayer, and the first organic encapsulating sublayer.

In some embodiments, forming the first amphiphilic cross-linking material layer is performed between forming one of the first inorganic encapsulating sublayer and the first organic encapsulating sublayer and forming another of the first inorganic encapsulating sublayer and the first organic encapsulating sublayer; and forming the first amphiphilic cross-linking material layer comprises curing a first amphiphilic cross-linking material of the first amphiphilic cross-linking material layer.

FIG. 6A-FIG. 6F are schematic diagrams illustrating a method of fabricating a display panel having an encapsulating structure in some embodiments according to the present disclosure.

Figure 6A:
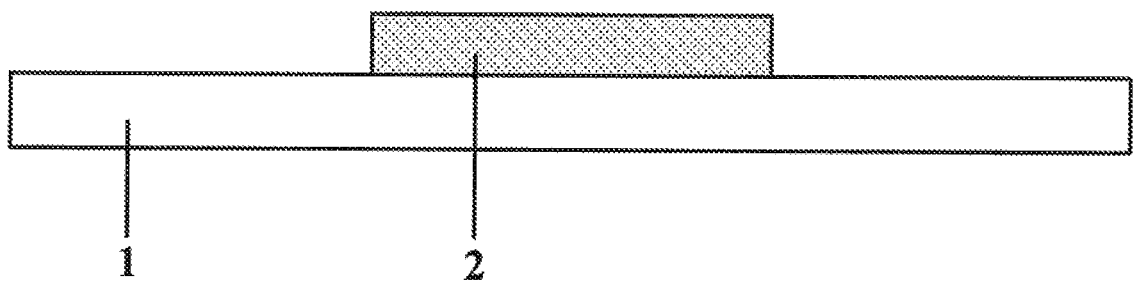
FIG. 6A-FIG. 6F are schematic diagrams illustrating a method of fabricating a display panel having an encapsulating structure in some embodiments according to the present disclosure.

Referring to FIG. 6A, in some embodiments, the method of fabricating a display panel includes obtaining a base substrate 1, forming a plurality of light emitting elements 2 on the base substrate 1. Optionally, the plurality of light emitting elements are OLED devices. In one example, the OLED devices can be formed using semi-conductor process. In another example, the base substrate 1 can be a glass base substrate, a quartz substrate, or a flexible substrate. For example, the base substrate 1 can be formed with the polyimide.

Figure 6B:
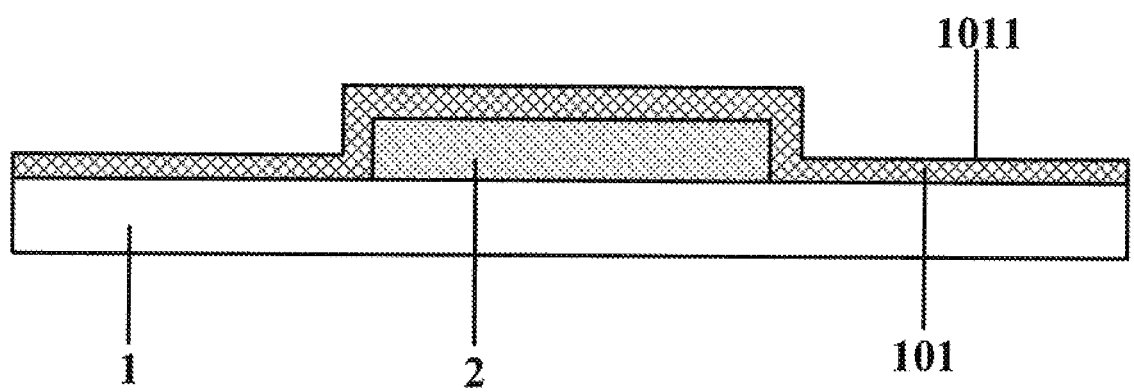

Referring to FIG. 6B, in some embodiments, the method of fabricating the display panel includes forming an encapsulating structure encapsulating the plurality of light emitting elements. Optionally, forming the encapsulating structure includes forming a first inorganic material layer 101. Optionally, a surface 1011 of the first inorganic material layer 101 distal the base substrate 1 includes a plurality of hydroxyl groups (—OH). For example, the first inorganic material layer 101 can be formed by plasma enhanced chemical vapor deposition or atomic deposition. Optionally, the first inorganic material layer 101 is used to form the first inorganic encapsulating sublayer.

In some embodiments, the first inorganic material layer 101 includes a first inorganic material, the first inorganic material is inorganic material. Various appropriate inorganic materials may be used for making the first inorganic material layer 101. Examples of inorganic materials suitable for making the first inorganic material layer 101 includes, but not limited to, silicon oxide, silicon nitride, and silicon oxynitride. Optionally, at least a portion of the first inorganic material on the surface 1011 of the first inorganic material layer 101 reacted with water in the air to form a plurality of hydroxyl groups (—OH). Optionally, by artificial wetting, at least a portion of the first inorganic material on the surface 1011 of the first inorganic material layer 101 reacted with water on the surface 1011 to form a plurality of hydroxyl groups (—OH). In one example, the first inorganic material is silicon oxides, at least a portion of the silicon oxides on the surface 1011 of the first inorganic material layer 101 reacted with the water in air to form a plurality of hydroxyl groups (—OH). In another example, the first inorganic material is silicon nitrides, at least a portion of the silicon nitrides on the surface 1011 of the first inorganic material layer 101 reacted with the water in air to form silicon oxides, and further forming a plurality of hydroxyl groups (—OH). In another example, the first inorganic material is silicon oxynitrides, at least a portion of the silicon oxynitrides on the surface 1011 of the first inorganic material layer 101 reacted with the water in air to form a plurality of hydroxyl groups (—OH).

Figure 6C:
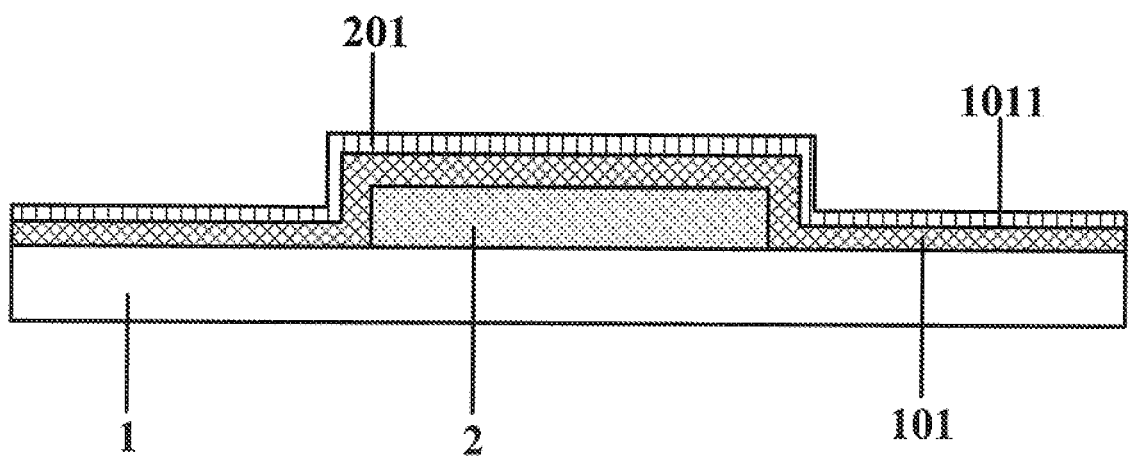

Referring to FIG. 6C, in some embodiments, forming the encapsulating structure includes forming a first amphiphilic cross-linking material layer 201 on a side of the first inorganic material layer 101 distal to the base substrate 1. Optionally, the first amphiphilic cross-linking material layer 201 includes a first cross-linking material including a plurality of first functional groups and a plurality of second functional groups. Optionally, the plurality of second functional groups are different from the plurality of first functional groups. Optionally, the first amphiphilic cross-linking material layer 201 is in direct contact with the surface 1011 of the first inorganic material layer 101. For example, the first amphiphilic cross-linking material layer 201 can be formed by coating or by inkjet.

In some embodiments, forming the encapsulating structure further includes reacting at least a portion of the plurality of first functional groups of the first amphiphilic cross-linking material layer 201 with the first inorganic material layer 101. The portion of the plurality of first functional groups reacted with the first inorganic material layer 101 forming a plurality of first chemical bonds.

Figure 6D:
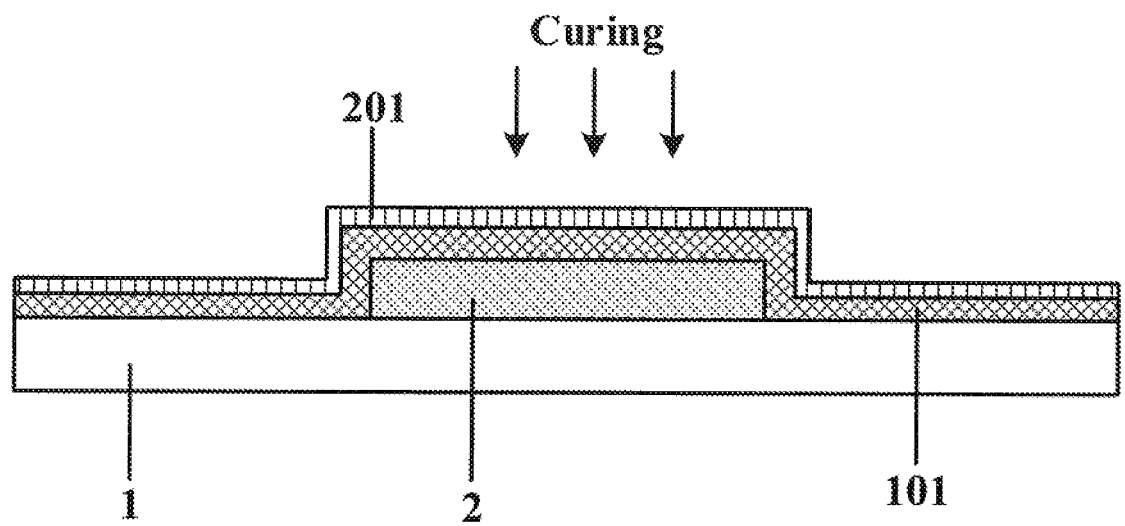

Referring to FIG. 6D, in some embodiments, before forming a first organic material layer, forming the encapsulating structure further includes curing the first amphiphilic cross-linking material layer 201. In one example, curing the first amphiphilic cross-linking material layer 201 includes drying the first amphiphilic cross-linking material layer 201 in a room temperature. In another example, curing the first amphiphilic cross-linking material layer 201 includes letting the first amphiphilic cross-linking material layer 201 stand for 20 to 30 minutes, e.g. 20 to 25 minute, 25 to 30 minutes. In another example, curing the first amphiphilic cross-linking material layer 201 includes performing ventilation drying or heat drying on the first amphiphilic cross-linking material layer 201.

Figure 6E:
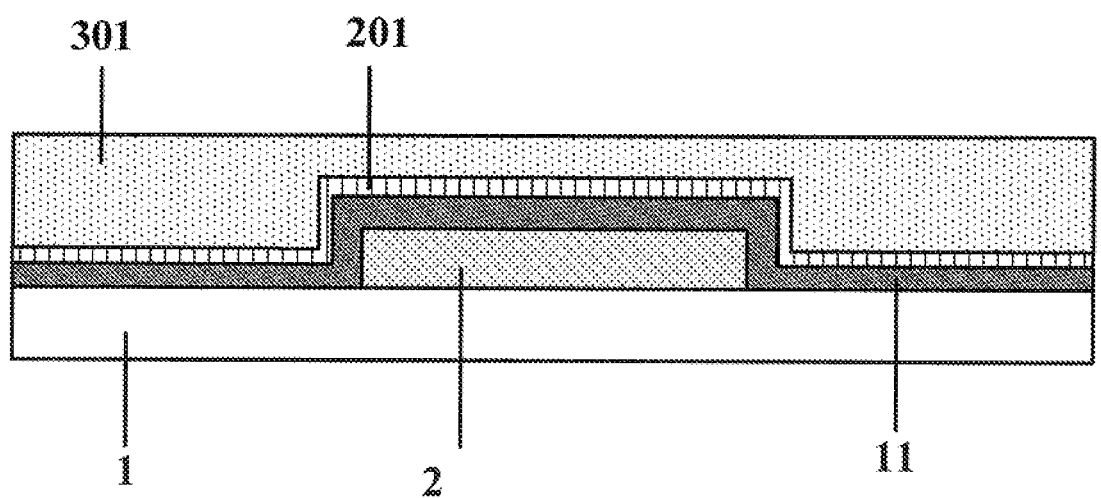

Referring to FIG. 6E, in some embodiments, forming the encapsulating structure further includes forming a first organic material layer 301 on a side of the first amphiphilic cross-linking material layer 201 distal to the first inorganic material layer 101. Optionally, the first organic material layer 301 is in direct contact with the first amphiphilic cross-linking material layer 201. Optionally, the first organic material layer 301 is used to form the first organic encapsulating sublayer.

In some embodiment, forming the encapsulating structure further includes reacting at least a portion of a plurality of second functional groups of the first amphiphilic cross-linking material layer 201 with the first organic material layer 301. Optionally, the portion of the plurality of second functional groups reacted with the first organic material layer 301 forming a plurality of second chemical bonds different from the plurality of first chemical bonds.

Figure 6F:
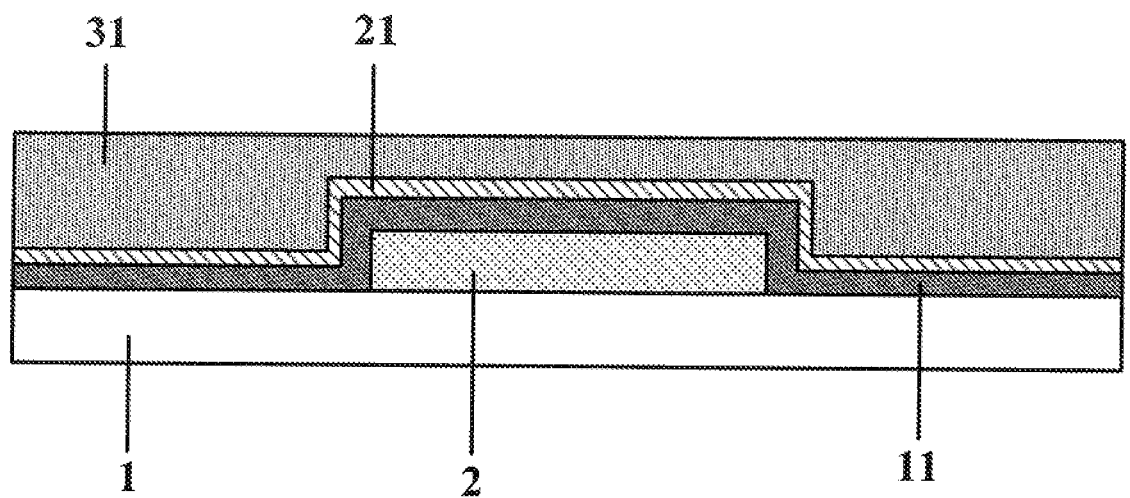

Referring to FIG. 6F, in some embodiments, after curing the first organic material layer 301, the first inorganic encapsulating sublayer 11, and the first amphiphilic cross-linking sublayer 21, and the first organic encapsulating sublayer 31 in the encapsulating structure are formed. The plurality of first functional groups binds with the first inorganic encapsulating sublayer 11 using a plurality of first chemical bonds. The plurality of second functional groups binds with the first organic encapsulating sublayer 31 using a plurality of second chemical bonds.

In some embodiments, the first cross-linking material includes a silane coupling agent. The plurality of first functional groups are a plurality of —SiX groups. The plurality of second functional groups are a plurality of —R groups. X is selected from a group consisting of a halogen, an alkoxy group, and an acyloxy group. —R is selected from a group consisting of an oxy group, a decyl group, a vinyl group, an epoxy group, an amide group, and an aminopropyl group. Optionally the first cross-linking material is the silane couple agent. Optionally, the plurality of first chemical bonds are a plurality of first covalent bonds; and the plurality of second chemical bonds are a plurality of second covalent bonds. For example, the plurality of first chemical bonds are hydrogen bonds. Optionally, the plurality of first functional groups reactive with the first inorganic encapsulating sublayer 11 form a first crosslinked network at a first interface between the first inorganic encapsulating sublayer 11 and the first amphiphilic cross-linking sublayer 21. Optionally, the plurality of second functional groups reactive with the first organic encapsulating sublayer 31 form a second crosslinked network at a second interface between the first organic encapsulating sublayer 31 and the first amphiphilic cross-linking sublayer 21. The first crosslinked network may enhance the binding strength between the first inorganic encapsulating sublayer 11 and the first amphiphilic cross-linking sublayer 21. The second crosslinked network may enhance the binding strength between the first organic encapsulating sublayer 31 and the first amphiphilic cross-linking sublayer 21.

Optionally, the silane coupling agent includes one or a combination of 3-aminopropyltriethoxysilane and 3-glycidoxypropyltrimethoxysilane. Optionally, the first inorganic encapsulating sublayer 11 includes one or a combination of silicon oxide, silicon nitride, and silicon oxynitride. Optionally, the first organic encapsulating sublayer 31 includes one or a combination of an epoxy resin and an acrylic resin. Optionally, the plurality of hydroxyl groups (—OH) are present on surfaces of the one or the combination of silicon oxide, silicon nitride, and silicon oxynitride, achieving an excellent binding between the first inorganic encapsulating sublayer 11 and the first organic encapsulating sublayer 31. In one example, in the process of forming an encapsulating structure, the material forming the first inorganic encapsulating sublayer 11 is silicon oxide. At least a portion of the material (e.g. silicon oxide) on a surface of the first inorganic encapsulating sublayer 11 reacted with the water in the air forming a plurality of hydroxyl groups (—OH). In another example, the material forming the first inorganic encapsulating sublayer 11 is silicon nitride. At least a portion of the material (e.g. silicon nitride) on the surface of the first inorganic encapsulating sublayer 11 reacted with the water in air forming a plurality of silicon oxides, and further forming a plurality of hydroxyl groups (—OH) on the surface of the first inorganic encapsulating sublayer 11. In another example, the material forming the first inorganic encapsulating sublayer 11 is silicon oxynitride. At least a portion of the material (e.g. silicon oxynitride) on the surface of the first inorganic encapsulating sublayer 11 reacted with the water in air forming a plurality of hydroxyl groups (—OH).

In some embodiments, the silane coupling agent includes 3-aminopropyltriethoxysilane, t be plurality of first functional groups of the silane coupling agent is siloxy, the plurality of second function groups of the silane coupling agent is aminopropyl. Optionally, the silane coupling agent includes 3-glycidoxypropyltrimethoxysilane, the plurality of first functional groups of the silane coupling agent is siloxy, the plurality of second function groups of the silane coupling agent is oxyl. In one example, at least a portion of the plurality of first functional groups (e.g. siloxy) reacted with at least a portion of the plurality of hydroxyl groups (—OH) on the surface of the first inorganic encapsulating sublayer 11 forming the plurality of first chemical bonds. In another example, at least a portion of the plurality of second functional groups (e.g. aminopropyl, oxyl) reacted with the first organic encapsulating sublayer 31 forming the plurality of the second chemical bonds, the first organic encapsulating sublayer 31 includes one or a combination of an epoxy resin and an acrylic resin. The binding strength between the one or the combination of 3-aminopropyltriethoxysilane and 3-glycidoxypropyltrimethoxysilane and the first inorganic encapsulating sublayer 11 is relatively strong. And the binding strength between the one or the combination of 3-aminopropyltriethoxysilane and 3-glycidoxypropyltrimethoxysilane and the first organic encapsulating sublayer 31 is relatively strong. The binding between the first inorganic encapsulating sublayer 11 and the first organic encapsulating sublayer 31 is relatively strong. Optionally, the amount of the plurality of hydroxyl groups (—OH) on a surface of silicon oxide is relatively rich, the binding strength between the first inorganic encapsulating sublayer 11 formed by silicon oxide and the silane coupling agent is stronger, and the effect of binding between the first inorganic encapsulating sublayer 11 and the first organic encapsulating sublayer 31 is better.

FIG. 7A-FIG. 7F are schematic diagrams illustrating a method of fabricating a display panel having an encapsulating structure in some embodiments according to the present disclosure.

Figure 7A:
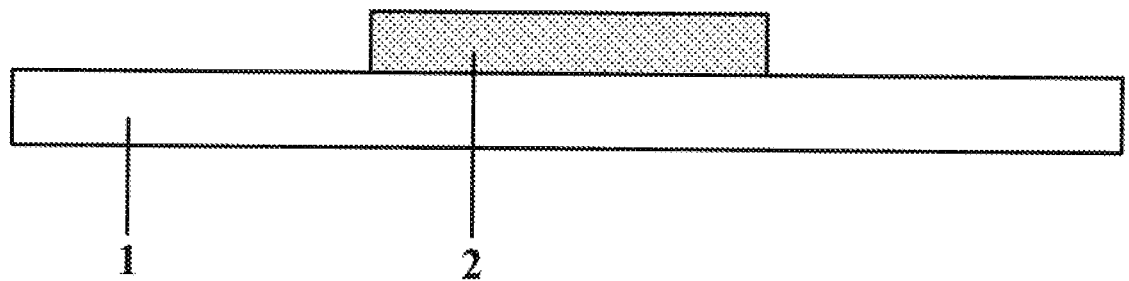
FIG. 7A-FIG. 7F are schematic diagrams illustrating a method of fabricating a display panel having an encapsulating structure in some embodiments according to the present disclosure.

Referring to FIG. 7A, in some embodiments, the method of fabricating a display panel includes obtaining a base substrate 1, forming a plurality of light emitting elements 2 on the base substrate 1. Optionally, the plurality of light emitting elements 2 are a plurality of organic light emitting diodes. In one example, the plurality of organic light emitting diodes can be formed by a lithographic process. In another example, the base substrate 1 can be a glass base substrate, a quartz substrate, or a flexible substrate. For example, the base substrate 1 can be formed with the polyimide.

Figure 7B:
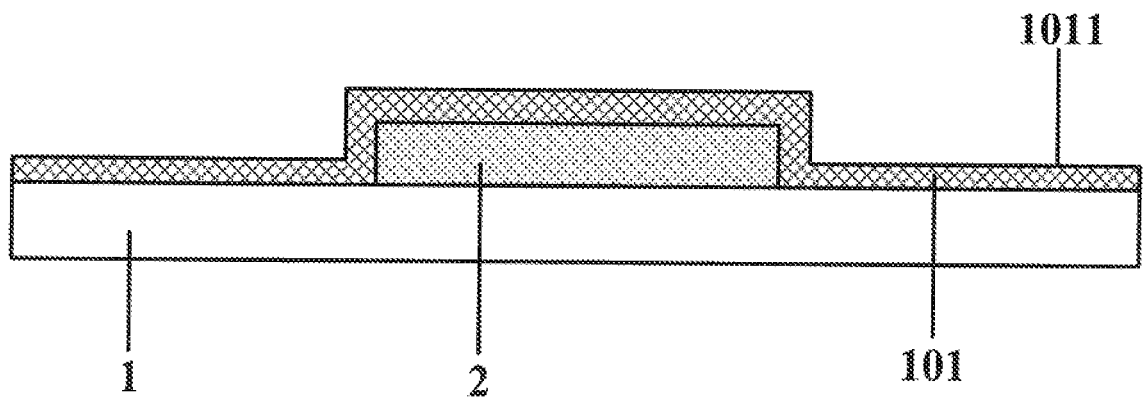

Referring to FIG. 7B, in some embodiments, the method of fabricating the display panel includes forming an encapsulating structure encapsulating the plurality of light emitting elements. Optionally, forming the encapsulating structure includes first forming a first inorganic material layer 101. Optionally, a surface 1011 of the first inorganic material layer 101 distal the base substrate 1 includes a plurality of hydroxyl groups (—OH). For example, the first inorganic material layer 101 can be formed by plasma enhanced chemical vapor deposition or atomic deposition. Optionally, the first inorganic material layer 101 is used to form the first inorganic encapsulating sublayer.

Figure 7C:
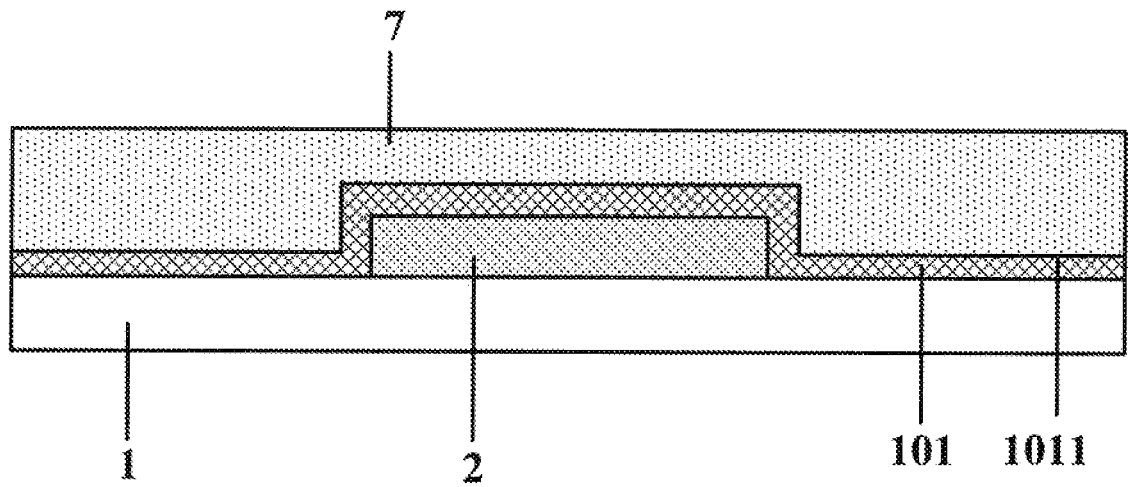

Referring to FIG. 7C, forming the encapsulating structure further includes mixing a fourth cross-linking material and a first organic material, obtaining a mixture organic material; forming a mixture organic material layer 7 on a side of the first inorganic material layer 101 distal to the base substrate 1 using the mixture organic material. Optionally, the mixture organic material layer 7 is in direct contact with the surface 1011 of the first inorganic material layer 101. Optionally, the fourth cross-linking material includes a plurality of seventh functional groups reactive with the first inorganic material layer 101 and a plurality of eighth functional groups reactive with the first organic material in the mixture organic material. The plurality of seventh functional groups are different from the plurality of eight functional groups.

Figure 7D:
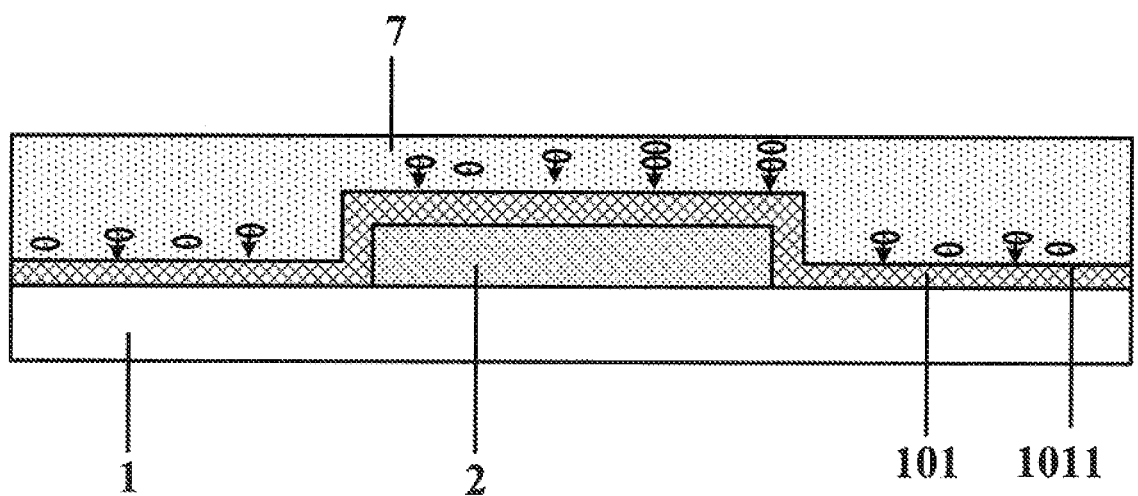

Referring to FIG. 7D, in some embodiments, forming the encapsulating structure further includes drying the mixture organic material layer 7. Optionally, drying the mixture organic material layer 7 includes drying the mixture organic material layer 7 in a room temperature. Optionally, drying the mixture organic material layer 7 includes letting the mixture organic material layer 7 stand for 20 to 30 minutes, e.g. 20 to 25 minute, 25 to 30 minutes.

Figure 7E:
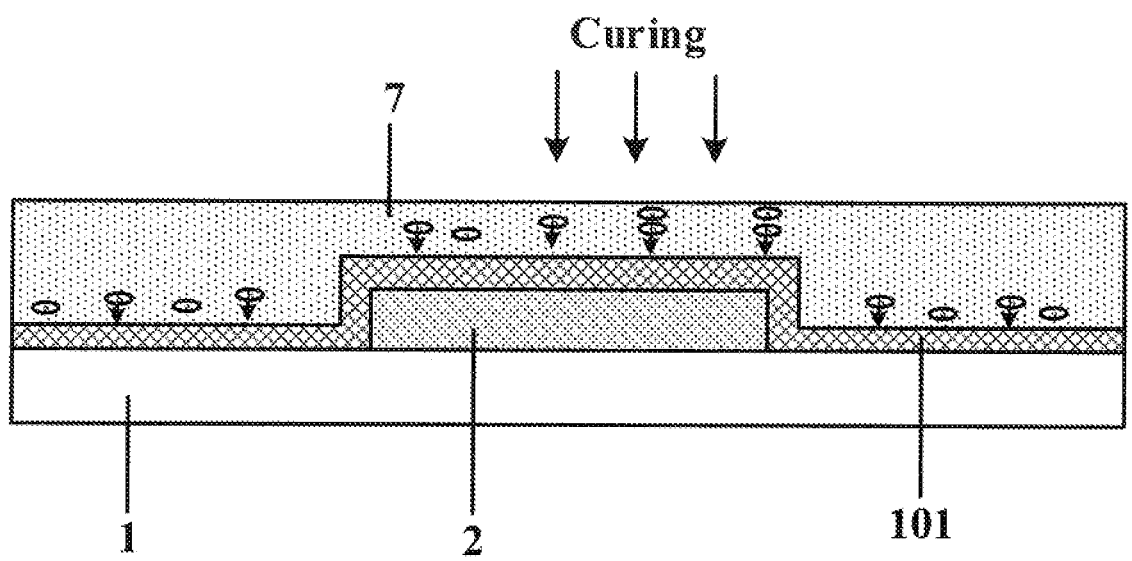

Referring to FIG. 7E, in some embodiments, forming the encapsulating structure further includes curing the mixture organic material layer 7. Optionally, the curing process can be performed using UV curing or hear curing.

Referring to FIG. 7D, in some embodiments, during the process of letting the mixture organic material layer 7 stand for a duration, the fourth cross-linking material in the mixture organic material layer 7 migrate toward a third interface between the first inorganic material layer 101 and the mixture organic material layer 7. Optionally, at least a portion of the seventh functional groups in the fourth cross-linking material migrated to the third interface reacts with the plurality of hydroxyl groups (—OH) on the surface 1011 of the first inorganic material layer 101, forming a plurality of seventh chemical bonds. Subsequent to forming the plurality of seventh chemical bonds, the first inorganic material layer 101 forms the first inorganic encapsulating sublayer 11 shown in FIG. 7F.

In some embodiments, during the process of letting the mixture organic material layer 7 stand for a duration, at least a portion the plurality of eighth functional groups reacted with the first organic material in the mixture organic material layer 7, forming a plurality of eighth chemical bonds. Subsequent to forming the plurality of eighth chemical bonds, the mixture organic material layer 7 forms the first organic encapsulating sublayer 31 shown in FIG. 7F.

Figure 7F:
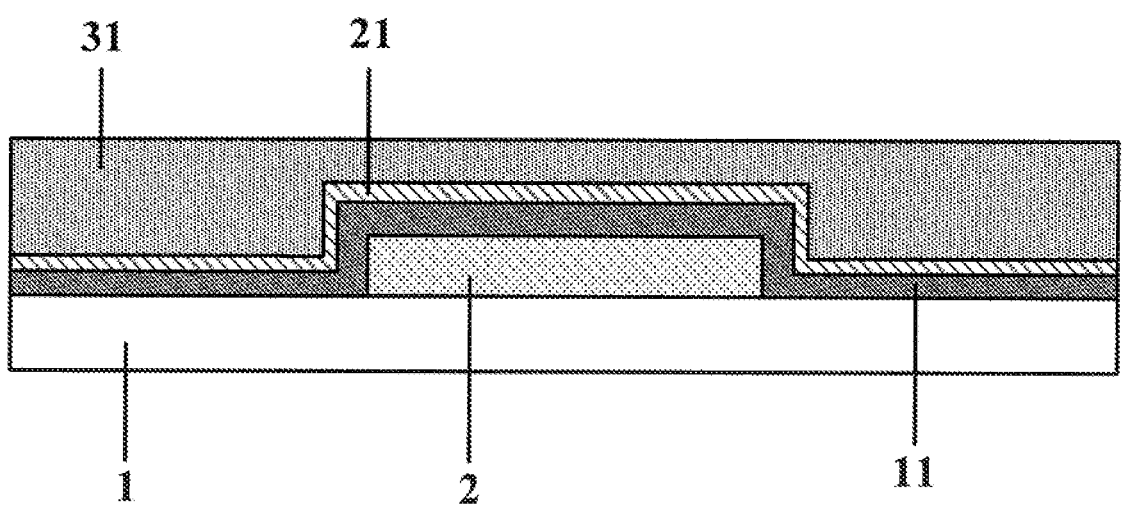

In some embodiments, the fourth cross-linking material migrated to the third interface forms the plurality of seventh chemical bonds with the first inorganic material layer 101 and forms the plurality of eighth chemical bonds with the first organic material in the mixture organic material layer 7, thereby forming the first amphiphilic cross-linking sublayer 21 between the first inorganic encapsulating sublayer 11 and the first organic encapsulating sublayer 31, as shown in FIG. 7F.

In some embodiments, the mixture organic material layer 7 includes approximately 0.1% w/w to approximately 5% w/w of the fourth cross-linking material.

In some embodiments, the method further includes forming a second amphiphilic cross-linking sublayer on a side of the first organic encapsulating sublayer distal to the first inorganic encapsulating sublayer and forming a second inorganic encapsulating sublayer on a side of the second amphiphilic cross-linking sublayer distal to the first organic encapsulating sublayer. Optionally, the second amphiphilic cross-linking sublayer is formed to be in direct contact with both the first organic encapsulating sublayer and the second inorganic encapsulating sublayer. Optionally, the second amphiphilic cross-linking sublayer includes a second cross-linking material including a plurality of third functional groups reactive with the second inorganic encapsulating sublayer and a plurality of fourth functional groups reactive with the first organic encapsulating sublayer, the plurality of fourth functional groups being different from the plurality of third functional groups. Optionally, at least a portion of the plurality of third functional groups reacted with the second inorganic encapsulating sublayer forming a plurality of third chemical bonds, at least a portion of the plurality of fourth functional groups reacted with the first organic encapsulating sublayer forming a plurality of fourth chemical bonds different from the plurality of third chemical bonds. Optionally, the plurality of third functional groups are same as the plurality of first functional groups. Optionally, the plurality of fourth functional groups are same as the plurality of second functional groups. Optionally, the plurality of third chemical bonds are same as the plurality of first chemical bonds. Optionally, the plurality of fourth chemical bonds are same as the plurality of second chemical bonds.

Figure 8A:
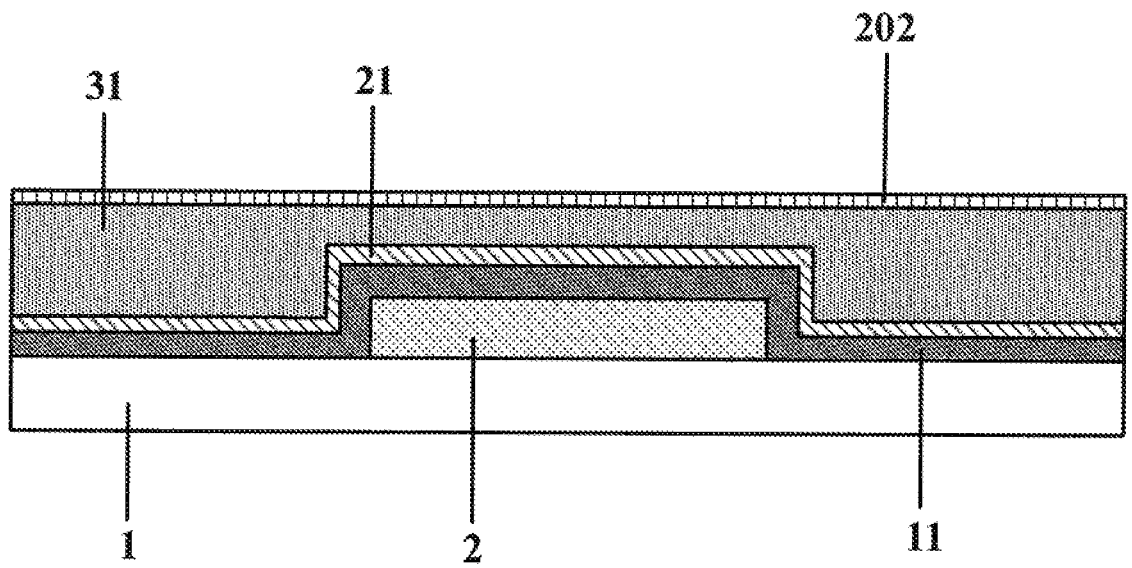
FIG. 8A-FIG. 8D are schematic diagrams illustrating a method of fabricating a display panel having an encapsulating structure in some embodiments according to the present disclosure.
Figure 8B:
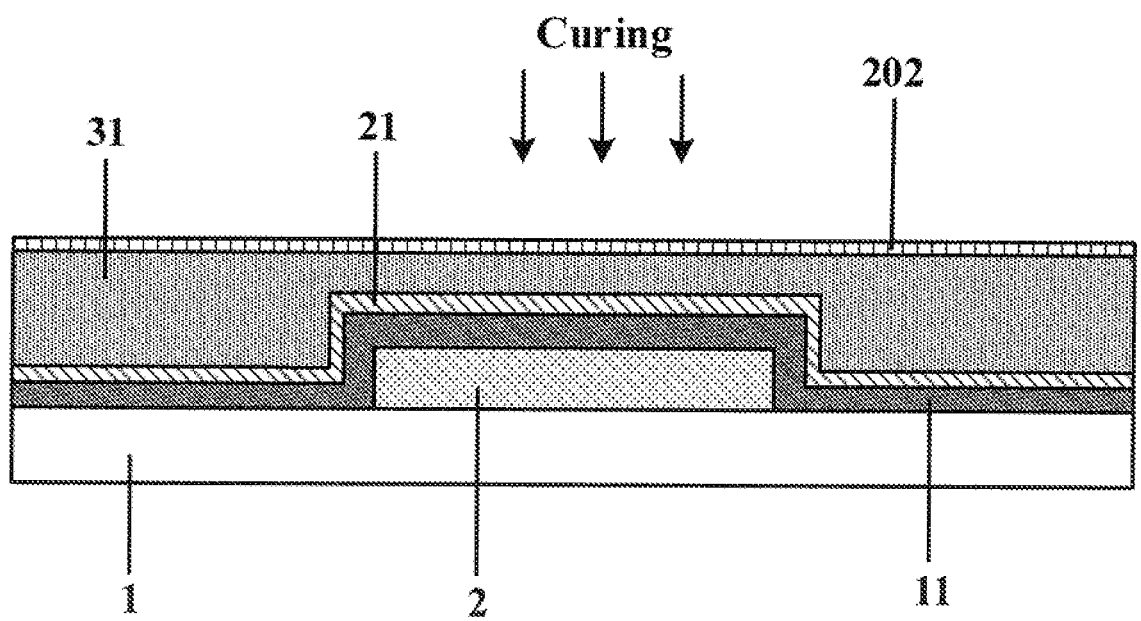
Figure 8C:
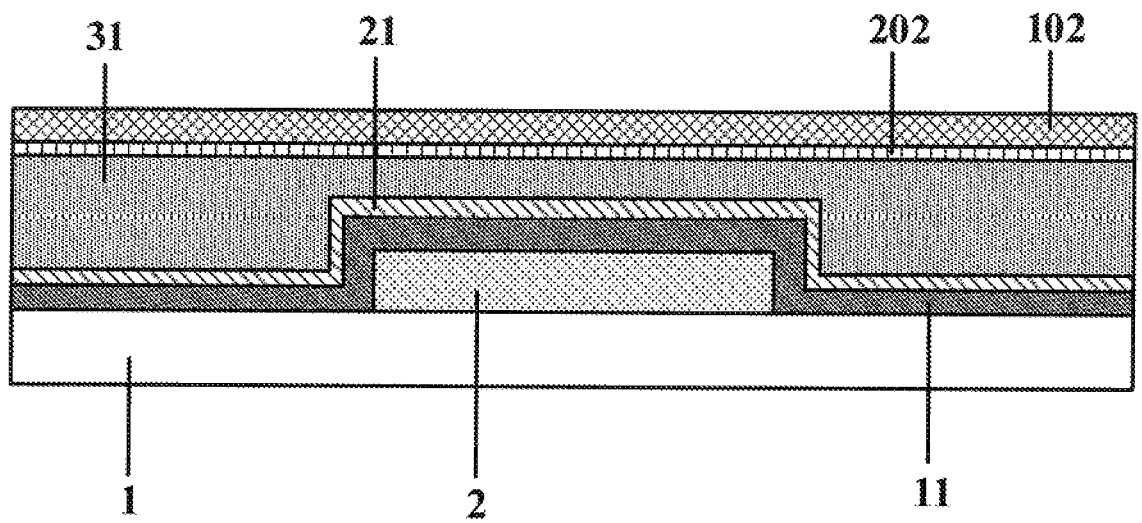
Figure 8D:
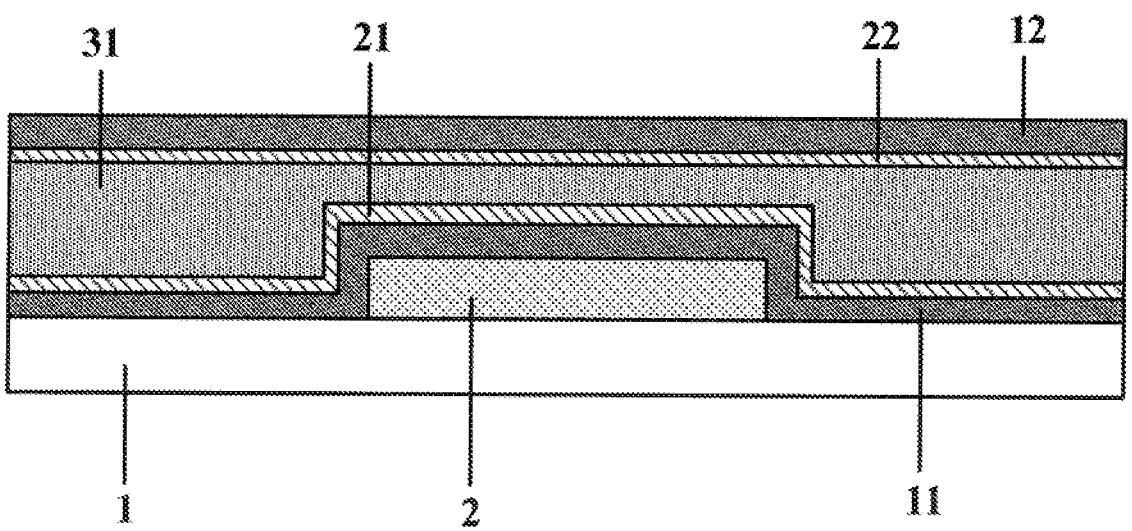

FIG. 8A and FIG. 8D are schematic diagrams illustrating a method of fabricating a display panel having an encapsulating structure in some embodiments according to the present disclosure. Referring to FIG. 8A, a second amphiphilic cross-linking material layer 202 is formed on a side of the first organic encapsulating sublayer 31 distal to the first inorganic encapsulating sublayer 11, and is formed to be in direct contact with the first organic encapsulating sublayer 31. For example, the second amphiphilic cross-linking material layer 202 may be formed by coating or in-jet printing. Optionally, the second amphiphilic cross-linking material layer 202 includes a same cross-linking material as the first amphiphilic cross-linking material layer 201 in FIG. 6C.

Referring to FIG. 8B, prior to forming the second inorganic encapsulating sublayer, the second amphiphilic cross-linking material layer 202 is cured. For example, the second amphiphilic cross-linking material layer 202 may be cured by heat, cured by air dry, or cured by allowing it to stand for a duration of 20 to 30 minutes.

Referring to FIG. 8C, a second inorganic material layer 102 is formed on a side of the second amphiphilic cross-linking material layer 202 distal to the second amphiphilic cross-linking material layer 202, and is formed to be in direct contact with the second amphiphilic cross-linking material layer 202. A surface of the second inorganic material layer 102 in direct contact with the second amphiphilic cross-linking material layer 202 includes hydroxyl group. In one example, the second inorganic material layer 102 can be formed by plasma enhanced chemical vapor deposition or atomic deposition. The plurality of third functional groups in the second amphiphilic cross-linking material layer 202 react with hydroxyl groups on the surface of the second inorganic material layer 102 in direct contact with the second amphiphilic cross-linking material layer 202, forming a plurality of third chemical bonds. The plurality of fourth functional groups in the second amphiphilic cross-linking material layer 202 react with the first organic encapsulating sublayer 31, forming a plurality of fourth chemical bonds. Accordingly, subsequent to formation of the plurality of third chemical bonds and the plurality of fourth chemical bonds, a second amphiphilic cross-linking sublayer 22 is formed on side of the first organic encapsulating sublayer 31 distal to the first inorganic encapsulating sublayer 11, and a second inorganic encapsulating sublayer 12 is formed on a side of the second amphiphilic cross-linking sublayer 22 distal to the first organic encapsulating sublayer 31, as shown in FIG. 8D. Optionally, the second inorganic encapsulating sublayer 12 and the first inorganic encapsulating sublayer 11 are made of a same inorganic material.

Optionally, the second amphiphilic cross-linking sublayer 22 includes a second cross-linking material having a plurality of third functional groups reactive with the second inorganic encapsulating sublayer 12 and a plurality of fourth functional groups reactive with the first organic encapsulating sublayer 31, the plurality of fourth functional groups being different from the plurality of third functional groups. Optionally, at least a portion of the plurality of third functional groups in the second amphiphilic cross-linking sublayer 22 reacted with the second inorganic encapsulating sublayer 12 forming a plurality of third chemical bonds, and at least a portion of the plurality of fourth functional groups in the second amphiphilic cross-linking sublayer 22 reacted with the first organic encapsulating sublayer 31 forming a plurality of fourth chemical bonds different from the plurality of third chemical bonds.

Optionally, the plurality of third chemical bonds are a plurality of third covalent bonds. Optionally, the plurality of fourth chemical bonds are a plurality of fourth covalent bonds. Optionally, the plurality of third functional groups reactive with the second inorganic encapsulating sublayer 12 form a third crosslinked network at a third interface between the second inorganic encapsulating sublayer 12 and the second amphiphilic cross-linking sublayer 22. Optionally, the plurality of fourth functional groups reactive with the first organic encapsulating sublayer 31 form a fourth cross-linked network at a fourth interface between the first organic encapsulating sublayer 31 and the second amphiphilic cross-linking sublayer 22.

Figure 9A:
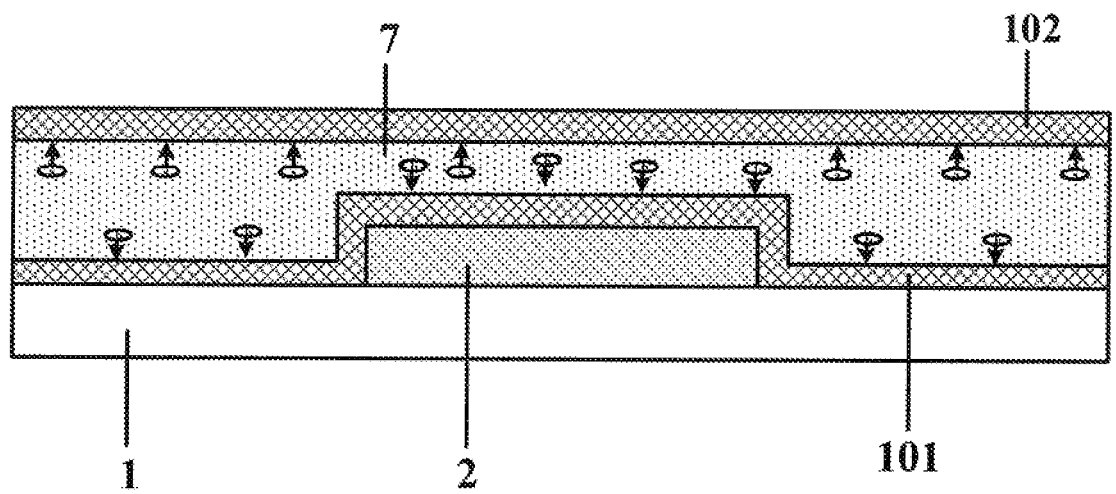
FIG. 9A-FIG. 9B are schematic diagrams illustrating a method of fabricating a display panel having an encapsulating structure in some embodiments according to the present disclosure.
Figure 9B:
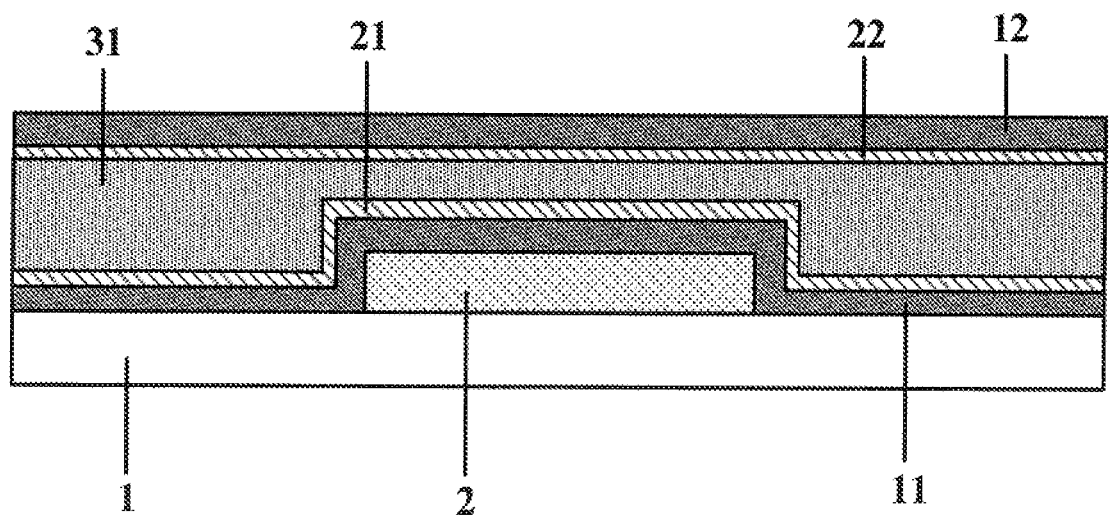

FIG. 9A and FIG. 9B are schematic diagrams illustrating a method of fabricating a display panel having an encapsulating structure in some embodiments according to the present disclosure. Referring to FIG. 9A, a plurality of light emitting elements 2 are formed on the base substrate 1, a first inorganic material layer 101 is formed on a side of the plurality of light emitting elements 2 distal to the base substrate 1, a mixture organic material layer 7 is formed on a side of the first inorganic material layer 101 distal to the base substrate 1, and a second inorganic material layer 102 is formed on a side of the mixture organic material layer 7 distal to the first inorganic material layer 101. The mixture organic material layer 7 is formed to be in direct contact with both the first inorganic material layer 101 and the second inorganic material layer 102. A surface of the first inorganic material layer 101 in direct contact with the mixture organic material layer 7 includes hydroxyl groups. A surface of the second inorganic material layer 102 in direct contact with the mixture organic material layer 7 includes hydroxyl groups.

The mixture organic material layer 7 includes a fourth cross-linking material and a first organic material. The fourth cross-linking material includes a plurality of seventh functional groups reactive with the first inorganic material layer 101 and the second inorganic material layer 102; and a plurality of eighth functional groups reactive with the first organic material in the mixture organic material of the mixture organic material layer 7. The plurality of seventh functional groups are different from the plurality of eight functional groups.

The mixture organic material layer 7 is allowed to stand for a duration. During the process of letting the mixture organic material layer 7 stand for the duration, the fourth cross-linking material in the mixture organic material layer 7 migrate toward a third interface between the first inorganic material layer 101 and the mixture organic material layer 7, as well as toward a fourth interface between the second inorganic material layer 102 and the mixture organic material layer. Optionally, at least a portion of the seventh functional groups in the fourth cross-linking material migrated to the third interface reacts with the plurality of hydroxyl groups (—OH) on the surface of the first inorganic material layer 101, forming a plurality of seventh chemical bonds; and at least a portion of the seventh functional groups in the fourth cross-linking material migrated to the fourth interface reacts with the plurality of hydroxyl groups (—OH) on the surface of the second inorganic material layer 102, also forming a plurality of seventh chemical bonds. Subsequent to forming the plurality of seventh chemical bonds, the first inorganic material layer 101 forms the first inorganic encapsulating sublayer 11, and the second inorganic material layer 102 forms the second inorganic encapsulating sublayer 12, as shown in FIG. 9B.

During the process of letting the mixture organic material layer 7 stand for the duration, at least a portion the plurality of eighth functional groups reacted with the first organic material in the mixture organic material layer 7, forming a plurality of eighth chemical bonds. Subsequent to forming the plurality of eighth chemical bonds, the mixture organic material layer 7 forms the first organic encapsulating sublayer 31, as shown in FIG. 9B.

The fourth cross-linking material migrated to the third interface forms the plurality of seventh chemical bonds with the first inorganic material layer 101 and forms the plurality of eighth chemical bonds with the first organic material in the mixture organic material layer 7, thereby forming the first amphiphilic cross-linking sublayer 21 between the first inorganic encapsulating sublayer 11 and the first organic encapsulating sublayer 31, as shown in FIG. 9B. The fourth cross-linking material migrated to the fourth interface forms the plurality of seventh chemical bonds with the second inorganic material layer 102 and forms the plurality of eighth chemical bonds with the first organic material in the mixture organic material layer 7, thereby forming the second amphiphilic cross-linking sublayer 22 between the second inorganic encapsulating sublayer 12 and the first organic encapsulating sublayer 31, as shown in FIG. 9B.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:
a base substrate;
a plurality of light emitting elements on the base substrate; and
an encapsulating structure encapsulating the plurality of light emitting elements;
wherein the encapsulating structure comprises:
a first inorganic encapsulating sublayer;
a first organic encapsulating sublayer;
a first amphiphilic cross-linking sublayer between the first inorganic encapsulating sublayer and the first organic encapsulating sublayer; and
the first amphiphilic cross-linking sublayer comprises a first cross-linking material comprising a plurality of first functional groups reactive with the first inorganic encapsulating sublayer and a plurality of second functional groups reactive with the first organic encapsulating sublayer, the plurality of second functional groups being different from the plurality of first functional groups.

2. The display panel of claim 1, wherein the plurality of first functional groups reactive with the first inorganic encapsulating sublayer form a first crosslinked network at a first interface between the first inorganic encapsulating sublayer and the first amphiphilic cross-linking sublayer; and
the plurality of second functional groups reactive with the first organic encapsulating sublayer form a second crosslinked network at a second interface between the first organic encapsulating sublayer and the first amphiphilic cross-linking sublayer.

3. The display panel of claim 1, wherein the first organic encapsulating sublayer comprises a mixture of a cross-linking material and an organic material at least partially cross-linked with each other.

4. A display apparatus, comprising the display panel of claim 1, and one or more integrated circuits connected to the display panel.

5. The display panel of claim 1, wherein at least a portion of the plurality of first functional groups reacted with the first inorganic encapsulating sublayer forming a plurality of first chemical bonds, at least a portion of the plurality of second functional groups reacted with the first organic encapsulating sublayer forming a plurality of second chemical bonds different from the plurality of first chemical bonds.

6. The display panel of claim 5, wherein the plurality of first chemical bonds are a plurality of first covalent bonds; and
the plurality of second chemical bonds are a plurality of second covalent bonds.

7. The display panel of claim 1, wherein the first cross-linking material comprises a silane coupling agent;
the plurality of first functional groups are a plurality of —SiX groups;
the plurality of second functional groups are a plurality of —R groups;
X is selected from a group consisting of a halogen, an alkoxy group, and an acyloxy group; and
—R is selected from a group consisting of an oxy group, a decyl group, a vinyl group, an epoxy group, an amide group, and an aminopropyl group.

8. The display panel of claim 7, wherein the silane coupling agent comprises one or a combination of 3-aminopropyltriethoxysilane and 3-glycidoxypropyltrimethoxysilane;
the first inorganic encapsulating sublayer comprises one or a combination of silicon oxide, silicon nitride, and silicon oxynitride; and
the first organic encapsulating sublayer comprises one or a combination of an epoxy resin and an acrylic resin.

9. The display panel of claim 1, wherein the encapsulating structure further comprises:
a second amphiphilic cross-linking sublayer on a side of the first organic encapsulating sublayer distal to the first inorganic encapsulating sublayer; and
a second inorganic encapsulating sublayer on a side of the second amphiphilic cross-linking sublayer distal to the first organic encapsulating sublayer.

10. The display panel of claim 9, wherein the second amphiphilic cross-linking sublayer comprises a second cross-linking material comprising a plurality of third functional groups reactive with the second inorganic encapsulating sublayer and a plurality of fourth functional groups reactive with the first organic encapsulating sublayer, the plurality of fourth functional groups being different from the plurality of third functional groups.

11. The display panel of claim 1, wherein the encapsulating structure further comprises:

a third amphiphilic cross-linking sublayer on a side of the first inorganic encapsulating sublayer distal to the first organic encapsulating sublayer; and a second organic encapsulating sublayer on a side of the third amphiphilic cross-linking sublayer distal to the first inorganic encapsulating sublayer.

12. The display panel of claim 11, wherein the third amphiphilic cross-linking sublayer comprises a third cross-linking material comprising a plurality of fifth functional groups reactive with the first inorganic encapsulating sublayer and a plurality of sixth functional groups reactive with the second organic encapsulating sublayer, the plurality of sixth functional groups being different from the plurality of fifth functional groups.

13. A method of fabricating a display panel, comprising:
forming a plurality of light emitting elements on a base substrate; and
forming an encapsulating structure encapsulating the plurality of light emitting elements;
wherein forming the encapsulating structure comprises:
forming a first inorganic encapsulating sublayer;
forming a first organic encapsulating sublayer; and
forming a first amphiphilic cross-linking sublayer;
wherein the first amphiphilic cross-linking sublayer is formed between the first inorganic encapsulating sublayer and the first organic encapsulating sublayer;
wherein the method comprises:
forming a first inorganic material layer, the first inorganic material layer comprising a first inorganic material;
forming a first organic material layer, the first organic material layer comprising a first organic material;
forming a first amphiphilic cross-linking material layer on a side of the first inorganic material layer facing the first organic material layer or on side of the first organic material layer facing the first inorganic material layer, the first amphiphilic cross-linking material layer is formed to be in direct contact with both the first inorganic material layer and the first organic material layer;
reacting at least a portion of a plurality of first functional groups of the first amphiphilic cross-linking material layer with the first inorganic encapsulating sublayer; and
reacting at least a portion of a plurality of second functional groups of the first amphiphilic cross-linking material layer with the first organic encapsulating sublayer, thereby forming the first inorganic encapsulating sublayer, the first amphiphilic cross-linking sublayer, and the first organic encapsulating sublayer.

14. The method of claim 13, wherein forming the first amphiphilic cross-linking material layer is performed between forming one of the first inorganic encapsulating sublayer and the first organic encapsulating sublayer and forming another of the first inorganic encapsulating sublayer and the first organic encapsulating sublayer; and forming the first amphiphilic cross-linking material layer comprises curing a first amphiphilic cross-linking material of the first amphiphilic cross-linking material layer.

15. The method of claim 13, wherein forming the encapsulating structure comprises:
forming a first inorganic material layer;
mixing a cross-linking material and an organic material to obtain a mixture organic material;
forming a mixture organic material layer on a side of the first inorganic material layer distal to the base substrate; and
allowing the cross-linking material in the mixture organic material layer to react with the first inorganic material layer at an interface between the first inorganic material layer and the mixture organic material layer, thereby forming the first inorganic encapsulating sublayer and the first amphiphilic cross-linking sublayer.

16. An encapsulating structure, comprising:
a first inorganic encapsulating sublayer;
a first organic encapsulating sublayer; and
a first amphiphilic cross-linking sublayer between the first inorganic encapsulating sublayer and the first organic encapsulating sublayer;
wherein the first amphiphilic cross-linking sublayer comprises a first cross-linking material comprising a plurality of first functional groups reactive with the first inorganic encapsulating sublayer and a plurality of second functional groups reactive with the first organic encapsulating sublayer, the plurality of second functional groups being different from the plurality of first functional groups.

17. The encapsulating structure of claim 16, comprising:
one or more inorganic encapsulating sublayers including the first inorganic encapsulating sublayer, and one or more organic encapsulating sublayers including the first organic encapsulating sublayer, the one or more inorganic encapsulating sublayers and the one or more organic encapsulating sublayers alternately stacked; and
one or more amphiphilic cross-linking sublayers each of which between one of the one or more inorganic encapsulating sublayers and an adjacent one of the one or more organic encapsulating sublayers.

* * * * *